United States Patent
Ishihara et al.

(10) Patent No.: US 10,812,093 B2
(45) Date of Patent: Oct. 20, 2020

(54) FREQUENCY SIGNAL GENERATION APPARATUS AND FREQUENCY SIGNAL GENERATION SYSTEM

(71) Applicant: Seiko Epson Corporation, Tokyo (JP)

(72) Inventors: Naoki Ishihara, Machida (JP); Koji Chindo, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 16/171,572

(22) Filed: Oct. 26, 2018

(65) Prior Publication Data

US 2019/0131985 A1 May 2, 2019

(30) Foreign Application Priority Data

Oct. 27, 2017 (JP) .................................. 2017-208099

(51) Int. Cl.
| | |
|---|---|
| H01S 1/06 | (2006.01) |
| H03B 17/00 | (2006.01) |
| H03L 7/26 | (2006.01) |
| G04F 5/14 | (2006.01) |

(52) U.S. Cl.
CPC .................. H03L 7/26 (2013.01); G04F 5/14 (2013.01); G04F 5/145 (2013.01)

(58) Field of Classification Search
CPC ............... H03L 7/26; G04F 5/14; G04F 5/145
USPC ................................................... 331/3, 94.1
See application file for complete search history.

(56) References Cited

U.S. PATENT DOCUMENTS

| | | |
|---|---|---|
| 2015/0061785 A1 | 3/2015 | Ishihara |
| 2015/0084707 A1 | 3/2015 | Maki |
| 2015/0180490 A1 | 6/2015 | Chindo |
| 2015/0180491 A1* | 6/2015 | Tanaka ...................... H03L 7/26 331/94.1 |
| 2015/0349791 A1 | 12/2015 | Nakajima |
| 2016/0308543 A1* | 10/2016 | Ishihara ................... H03L 7/26 |
| 2019/0181871 A1* | 6/2019 | Matsuda ................... H01S 1/06 |

FOREIGN PATENT DOCUMENTS

| | | |
|---|---|---|
| JP | 62-178557 U | 11/1987 |
| JP | 10-281883 A | 10/1998 |
| JP | 2012-195351 A | 10/2012 |

(Continued)

*Primary Examiner* — Richard Tan
(74) *Attorney, Agent, or Firm* — Harness, Dickey & Pierce, P.L.C.

(57) ABSTRACT

A frequency signal generation apparatus includes an atom cell including a first part including gaseous alkali metal atoms and a second part including liquid alkali metal atoms. A first temperature controller controls the first part's temperature. A second temperature controller controls the second part's temperature to be lower than that of the first part. First and second temperature detectors respectively detect the first and second parts' temperatures. The first temperature controller and the second temperature detector are thermally connected. The second temperature controller and the first temperature detector are thermally connected. The phase of a temperature control loop of the first part including the first temperature controller and the first temperature detector and the phase of a temperature control loop of the second part including the second temperature controller and the second temperature detector are different.

16 Claims, 10 Drawing Sheets

(56) References Cited

FOREIGN PATENT DOCUMENTS

| | | | |
|---|---|---|---|
| JP | 2012-195788 | A | 10/2012 |
| JP | 2015-053304 | A | 3/2015 |
| JP | 2015-070331 | A | 4/2015 |
| JP | 2015-122597 | A | 7/2015 |
| JP | 2015-231053 | A | 12/2015 |
| JP | 2017-011680 | A | 1/2017 |

* cited by examiner

FREQUENCY SIGNAL GENERATION APPARATUS AND FREQUENCY SIGNAL GENERATION SYSTEM

CROSS-REFERENCE TO RELATED APPLICATIONS

This application claims priority to Japanese Patent Application No. 2017-208099, filed Oct. 27, 2017, the entirety of which is hereby incorporated by reference.

BACKGROUND

1. Technical Field

The present invention relates to a frequency signal generation apparatus and frequency signal generation system.

2. Related Art

An atomic oscillator including a light source and an atom cell in which alkali metal atoms of rubidium, cesium, or the like are enclosed, and which oscillates according to energy transition of the alkali metal atoms, is known as a frequency signal generation apparatus.

For example, JP-A-10-281883 discloses a cell having a first cell part including a light incident surface, and a second cell part in which metal atoms in a vapor state can freely come and go between the first cell part and itself. In the cell disclosed in JP-A-10-281883, the first cell part is heated to a constant temperature at which sufficient light absorptance is obtained by first temperature control means controlled based on detection temperature information of a first temperature measuring element and a configuration of a heat-retaining tube. Further, the second cell part is maintained at a lower temperature than the temperature of the first cell part and is temperature-stabilized by second temperature control means controlled based on detection temperature information of a second temperature measuring element. In the cell disclosed in JP-A-10-281883, the entire cell except the second cell part is housed in the heat-retaining tube, and the first cell part and the second cell part may be independently temperature-controlled.

Here, not all of the alkali metal atoms within the atom cell are gasified, but a portion thereof becomes a liquid as an excess. The liquid alkali metal atoms present in the light passage region block light. To suppress the influence of the liquid alkali metal atoms, it is necessary to keep the part of the atom cell holding the liquid alkali metal atoms at a lower temperature than that of the part housing the gaseous alkali metal atoms, and thereby, keep the liquid alkali metal atoms in a predetermined location of the atom cell. Accordingly, in the atom cell, it is desired to temperature-control the part holding the liquid alkali metal atoms and the part housing the gaseous alkali metal atoms as independently as possible.

On the other hand, downsizing of the atom cell is desired. In a smaller atom cell, distances between the respective parts of the atom cell are smaller. Accordingly, the temperature control in the part holding the liquid alkali metal atoms and the temperature control in the part housing the gaseous alkali metal atoms affect each other and the temperature of the atom cell may be unstable. Thus, in the atom cell with the heat-retaining tube as in JP-A-10-281883, downsizing is difficult.

SUMMARY

An advantage of some aspects of the invention is to provide a frequency signal generation apparatus in which instability of a temperature of an atom cell can be suppressed. Another advantage of some aspects of the invention is to provide a frequency signal generation system in which instability of a temperature of an atom cell can be suppressed.

The invention can be implemented as the following embodiments or application examples.

Application Example 1

A frequency signal generation apparatus according to this application example includes a light source, an atom cell including a first part with gaseous alkali metal atoms therein through which light output from the light source passes and a second part with liquid alkali metal atoms therein, a first temperature control element that controls a temperature of the first part, a second temperature control element that controls a temperature of the second part to be a lower temperature than the temperature of the first part, a first temperature detection element that detects the temperature of the first part, and a second temperature detection element that detects the temperature of the second part, wherein the first temperature control element and the second temperature detection element are thermally connected, the second temperature control element and the first temperature detection element are thermally connected, and phase of a temperature control loop of the first part including the first temperature control element and the first temperature detection element and phase of a temperature control loop of the second part including the second temperature control element and the second temperature detection element are different.

In the frequency signal generation apparatus according to this application example, the phase of the temperature control loop of the first part and the phase of the temperature control loop of the second part are different. Accordingly, interference of the temperature control loop of the first part and the temperature control loop of the second part with each other can be further suppressed compared to the case where the phase of the temperature control loop of the first part and the phase of the temperature control loop of the second part are the same, and the first part and the second part can be independently controlled. Therefore, in the frequency signal generation apparatus according to the application example, instability of the temperature of the atom cell can be suppressed.

Application Example 2

In the frequency signal generation apparatus according to the application example, a distance between the first temperature control element and the first temperature detection element and a distance between the second temperature control element and the second temperature detection element may be different.

In the frequency signal generation apparatus according to this application example, the distance between the first temperature control element and the first temperature detection element and the distance between the second temperature control element and the second temperature detection element are different. Accordingly, the time until the temperature change generated in temperature control by the first temperature control element is transferred to the first temperature detection element and the time until the temperature change generated in temperature control by the second temperature control element is transferred to the second temperature detection element are different. Therefore, in the frequency signal generation apparatus according to the application example, the phase of the temperature control loop of the first part and the phase of the temperature control loop of the second part can be made different.

Application Example 3

In the frequency signal generation apparatus according to the application example, a distance between the second temperature control element and the second temperature detection element may be smaller than a distance between the first temperature control element and the first temperature detection element.

In the frequency signal generation apparatus according to this application example, the distance between the second temperature control element and the second temperature detection element is smaller than the distance between the first temperature control element and the first temperature detection element. Accordingly, the time until the temperature change generated in the temperature control by the second temperature control element is transferred to the second temperature detection element is shorter than the time until the temperature change generated in the temperature control by the first temperature control element is transferred to the first temperature detection element. Therefore, in the frequency signal generation apparatus according to the application example, the second part can be converged to a desired temperature faster than the first part.

Application Example 4

In the frequency signal generation apparatus according to the application example, a first member covering at least apart of the first part, and a second member separated from the first member and covering at least apart of the second part may be provided.

In the frequency signal generation apparatus according to this application example, the first member covering at least a part of the first part is provided, and the temperature of the first part can be stabilized more easily than that in the case without the first member. Further, the second member covering at least a part of the second part is provided, and the temperature of the second part can be stabilized more easily than that in the case without the second member. Furthermore, the first member and the second member are separated, and thereby, heat transfer between the first member and the second member can be suppressed and instability of the temperature of the atom cell can be suppressed.

Application Example 5

In the frequency signal generation apparatus according to the application example, the first temperature control element can be placed on the first member, the second temperature control element can be placed on the second member, and thermal conductivity of the first member and thermal conductivity of the second member can be different.

In the frequency signal generation apparatus according to this application example, the thermal conductivity of the first member and the thermal conductivity of the second member are different. Accordingly, the time until the temperature change generated in temperature control by the first temperature control element is transferred to the first temperature detection element and the time until the temperature change generated in temperature control by the second temperature control element is transferred to the second temperature detection element are different. Therefore, in the frequency signal generation apparatus according to the application example, the phase of the temperature control loop of the first part and the phase of the temperature control loop of the second part can be made different.

Application Example 6

In the frequency signal generation apparatus according to the application example, the first temperature control element may be connected to the first member by a first connection member, the second temperature control element may be connected to the second member by a second connection member, and thermal conductivity of the first connection member and thermal conductivity of the second connection member may be different.

In the frequency signal generation apparatus according to this application example, the thermal conductivity of the first connection member and the thermal conductivity of the second connection member are different. Accordingly, the time until the temperature change generated in temperature control by the first temperature control element is transferred to the first temperature detection element and the time until the temperature change generated in temperature control by the second temperature control element is transferred to the second temperature detection element are different. Therefore, in the frequency signal generation apparatus according to the application example, the phase of the temperature control loop of the first part and the phase of the temperature control loop of the second part can be made different.

Application Example 7

In the frequency signal generation apparatus according to the application example, the first temperature detection element may be placed on the first member, the second temperature detection element may be placed on the second member, and thermal conductivity of the first member and thermal conductivity of the second member may be different.

In the frequency signal generation apparatus according to this application example, the thermal conductivity of the first member and the thermal conductivity of the second member are different. Accordingly, the time until the temperature change generated in temperature control by the first temperature control element is transferred to the first temperature detection element and the time until the temperature change generated in temperature control by the second temperature control element is transferred to the second temperature detection element are different. Therefore, in the frequency signal generation apparatus according to the application example, the phase of the temperature control loop of the first part and the phase of the temperature control loop of the second part can be made different.

Application Example 8

In the frequency signal generation apparatus according to the application example, the first temperature detection element may be connected to the first member by a first connection member, the second temperature detection element may be connected to the second member by a second connection member, and thermal conductivity of the first connection member and thermal conductivity of the second connection member may be different.

In the frequency signal generation apparatus according to this application example, the thermal conductivity of the first connection member and the thermal conductivity of the second connection member are different. Accordingly, the time until the temperature change generated in temperature control by the first temperature control element is transferred to the first temperature detection element and the time until the temperature change generated in temperature control by the second temperature control element is transferred to the second temperature detection element are different. Therefore, in the frequency signal generation apparatus according to the application example, the phase of the temperature control loop of the first part and the phase of the temperature control loop of the second part can be made different.

Application Example 9

In the frequency signal generation apparatus according to the application example, a case housing the atom cell, the first member, and the second member is provided, wherein the first temperature control element may be placed on the case, the second temperature control element may be placed on the second member, and thermal conductivity of the case and thermal conductivity of the second member may be different.

In the frequency signal generation apparatus according to this application example, the thermal conductivity of the case and the thermal conductivity of the second member are different. Accordingly, the time until the temperature change generated in temperature control by the first temperature control element is transferred to the first temperature detection element and the time until the temperature change generated in temperature control by the second temperature control element is transferred to the second temperature detection element are different. Therefore, in the frequency signal generation apparatus according to the application example, the phase of the temperature control loop of the first part and the phase of the temperature control loop of the second part can be made different.

Application Example 10

In the frequency signal generation apparatus according to the application example, the temperature control loop of the first part may include a first circuit that outputs a signal according to output of the first temperature detection element to the first temperature control element, the temperature control loop of the second part may include a second circuit that outputs a signal according to output of the second temperature detection element to the second temperature control element, and gain of the first circuit and gain of the second circuit may be different.

In the frequency signal generation apparatus according to this application example, the gain of the first circuit and the gain of the second circuit are different. Accordingly, the response speed of the first temperature control element to the output of the first temperature detection element and the response speed of the second temperature control element to the output of the second temperature detection element are different. Therefore, in the frequency signal generation apparatus according to the application example, the phase of the temperature control loop of the first part and the phase of the temperature control loop of the second part can be made different.

Application Example 11

A frequency signal generation system according to this application example is a frequency signal generation system including a frequency signal generation apparatus, and frequency signal generation apparatus includes a light source, an atom cell including a first part with gaseous alkali metal atoms therein through which light output from the light source passes and a second part with liquid alkali metal atoms therein, a first temperature control element that controls a temperature of the first part, a second temperature control element that controls a temperature of the second part to be a lower temperature than the temperature of the first part, a first temperature detection element that detects the temperature of the first part, and a second temperature detection element that detects the temperature of the second part, wherein the first temperature control element and the second temperature detection element are thermally connected, the second temperature control element and the first temperature detection element are thermally connected, and phase of a temperature control loop of the first part including the first temperature control element and the first temperature detection element and phase of a temperature control loop of the second part including the second temperature control element and the second temperature detection element are different.

In the frequency signal generation system according to this application example, the phase of the temperature control loop of the first part and the phase of the temperature control loop of the second part are different. Accordingly, interference of the temperature control loop and the temperature control loop with each other may be further suppressed compared to the case where the phase of the temperature control loop of the first part and the phase of the temperature control loop of the second part are the same, and the first part and the second part can be independently controlled. Therefore, in the frequency signal generation system according to the application example, instability of the atom cell can be suppressed.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Embodiments of the invention will be explained in detail below using the drawings. Note that the embodiments to be explained do not limit the scope of the invention described in the appended Claims. Further, not all of the configurations to be explained are necessarily essential components of the invention.

1. First Embodiment 1.1. Configuration

Figure 1:
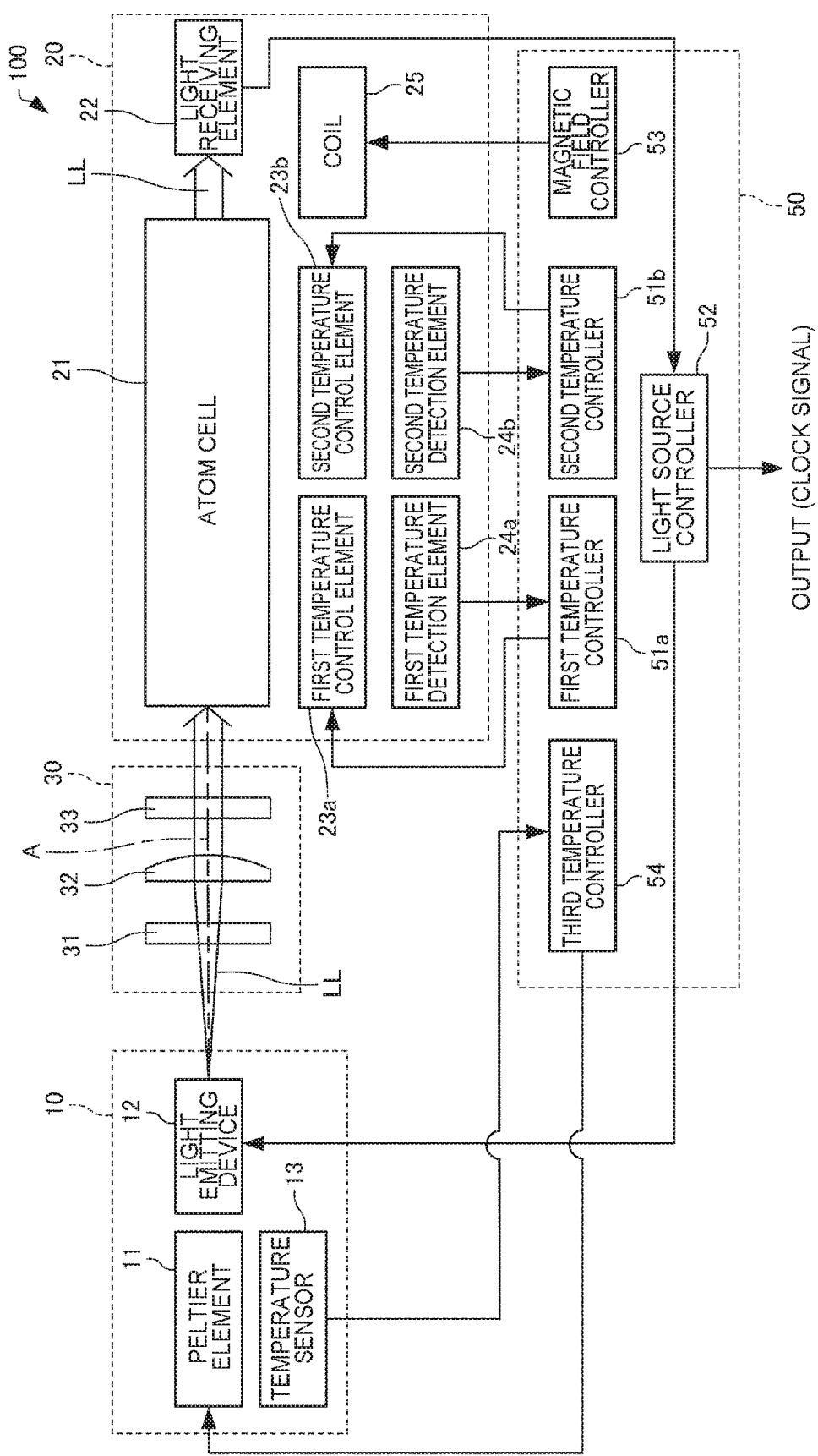
FIG. 1 is a schematic diagram showing a frequency signal generation apparatus according to the first embodiment.

First, a frequency signal generation apparatus according to the first embodiment will be explained with reference to the drawings. FIG. 1 is a schematic diagram showing a frequency signal generation apparatus 100 according to the first embodiment.

The frequency signal generation apparatus 100 is an atomic oscillator using a quantum interference effect (CPT: Coherent Population Trapping) that causes a phenomenon that, when two resonance lights (e.g. light beams or optical fields) having specific different wavelengths are simultaneously applied to alkali metal atoms, the two resonance lights are not absorbed by the alkali metal atoms, but transmitted through the atoms. The quantum interference effect phenomenon is also called an electromagnetically induced transparency (EIT) phenomenon. Or, the frequency signal generation apparatus according to the invention may be an atomic oscillator using a double resonance phenomenon by light or microwave.

As shown in FIG. 1, the frequency signal generation apparatus 100 includes a light emitting device module 10, an atom cell unit 20, an optical system unit 30 provided between the light emitting device module 10 and the atom cell unit 20, and a control unit 50 that controls operation of the light emitting device module 10 and the atom cell unit 20. First, a schematic configuration of the frequency signal generation apparatus 100 will be explained below.

The light emitting device module 10 has a Peltier element 11, a light emitting device 12, and a temperature sensor 13. The light emitting device 12 outputs linearly-polarized light LL containing two kinds of lights having different frequencies. The temperature sensor 13 detects the temperature of the light emitting device 12. The Peltier element 11 adjusts the temperature of the light emitting device 12.

The optical system unit 30 has a dimming filter 31, a lens 32, and a quarter-wave plate 33. The dimming filter 31 reduces the intensity of the light LL output from the light emitting device 12. The lens 32 adjusts the radiation angle of the light LL. Specifically, the lens 32 parallelizes the light LL. The quarter-wave plate 33 converts the two kinds of lights having different frequencies contained in the light LL from linearly-polarized lights into circularly-polarized lights i.e., right circularly-polarized lights or left circularly-polarized lights.

The atom cell unit 20 has an atom cell 21, a light receiving element 22, a first temperature control element 23a, a second temperature control element 23b, a first temperature detection element 24a, a second temperature detection element 24b, and a coil 25.

The atom cell 21 has light transmissivity and houses an alkali metal. The alkali metal atom has energy levels of a three-level system of two ground levels different from each other and an excited level. The light LL output from the light emitting device 12 enters the atom cell 21 via the dimming filter 31, the lens 32, and the quarter-wave plate 33. Then, the light receiving element 22 receives and detects the light LL passing through the atom cell 21.

The first temperature control element 23a heats the alkali metal atoms housed in the atom cell 21 to gasify at least part of the alkali metal atoms. The first temperature detection element 24a detects the temperature of the atom cell 21. The second temperature control element 23b heats the atom cell 21 to e.g. a temperature lower than that of the first temperature control element 23a. The second temperature detection element 24b detects the temperature of the atom cell 21.

The coil 25 applies a magnetic field in a predetermined direction to the alkali metal atoms housed in the atom cell 21 to Zeeman-split the energy levels of the alkali metal atoms. In the Zeeman split state of the alkali metal atoms, when a resonance light pair of circularly-polarized lights are applied to the alkali metal atoms, of the plurality of levels at which the alkali metal atoms are Zeeman-split, the number of alkali metal atoms at the desired energy level may be made larger relative to the number of alkali metal atoms at the other energy levels. Accordingly, the number of atoms that express the desired EIT phenomenon increases and the desired EIT signal becomes larger. As a result, the oscillation characteristics of the frequency signal generation apparatus 100 may be improved.

The control unit 50 has a first temperature controller 51a, a second temperature controller 51b, a light source controller 52, a magnetic field controller 53, and a third temperature controller 54. The first temperature controller 51a controls energization to the first temperature control element 23a so that the temperature inside of the atom cell 21 may be a desired temperature based on the detection result of the first temperature detection element 24a. The second temperature controller 51b controls energization to the second temperature control element 23b so that the temperature inside of the atom cell 21 may be a desired temperature based on the detection result of the second temperature detection element 24b. The magnetic field controller 53 controls energization to the coil 25 so that the magnetic field generated by the coil 25 may be constant. The third temperature controller 54 controls energization to the Peltier element 11 so that the temperature of the light emitting device 12 may be a desired temperature based on the detection result of the temperature sensor 13.

The light source controller 52 controls the frequencies of the two kinds of lights contained in the light LL output from the light emitting device 12 so that the EIT phenomenon may occur based on the detection result of the light receiving element 22. Here, when the two kinds of lights become the resonance light pair having a frequency difference corresponding to the energy difference between the two ground levels of the alkali metal atoms housed in the atom cell 21, the EIT phenomenon occurs. The light source controller 52 includes a voltage controlled oscillator (VCO, not shown) in which the oscillation frequency is controlled to be stabilized in synchronization with the control of the frequencies of the two kinds of lights, and outputs the output signal of the voltage controlled oscillator as an output signal (clock signal) of the frequency signal generation apparatus 100.

The schematic configuration of the frequency signal generation apparatus 100 is explained above. The more specific configuration of the frequency signal generation apparatus 100 will be explained below with reference to FIGS. 2 and 3.

Figure 2:
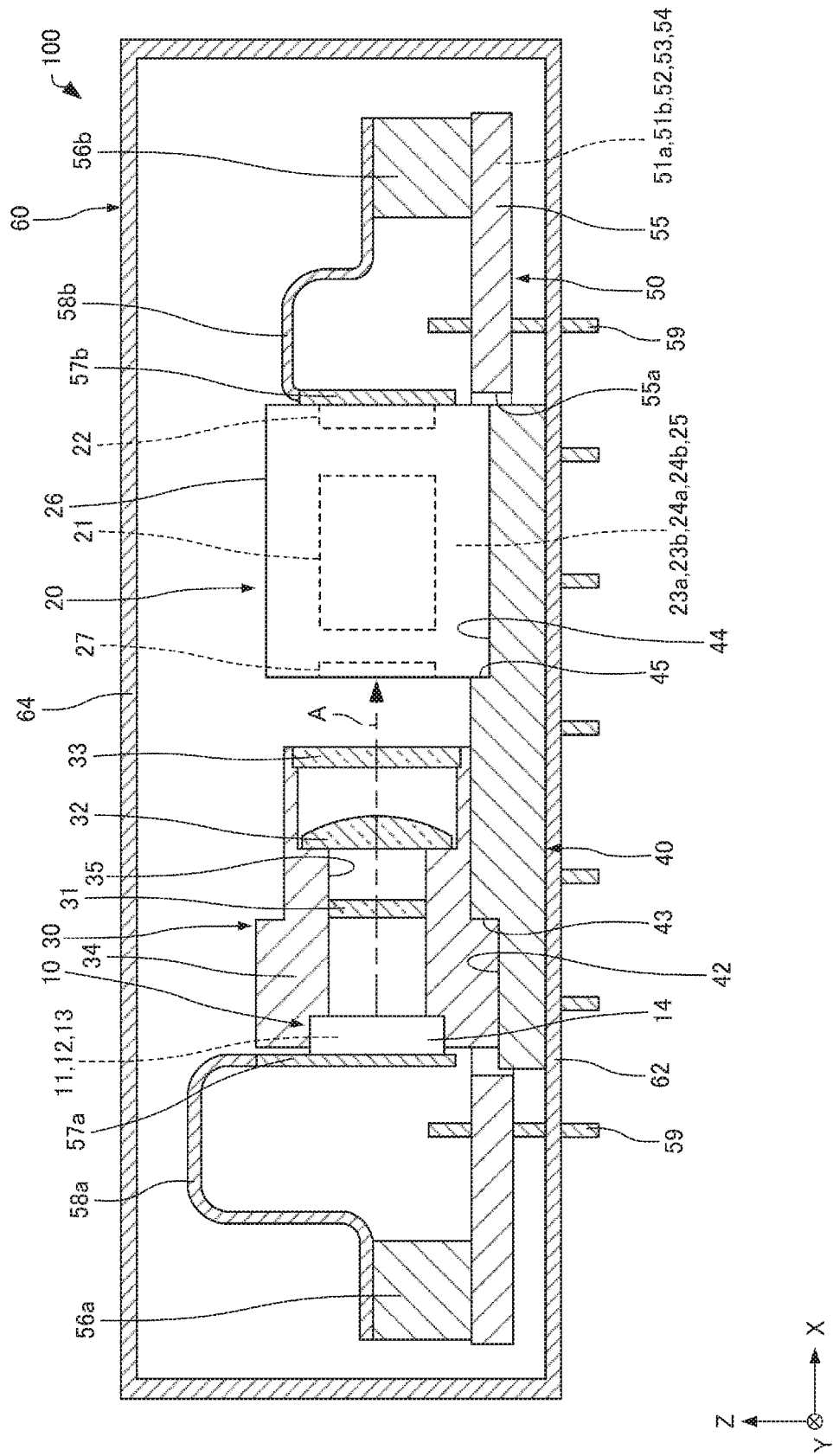
FIG. 2 is a sectional view schematically showing the frequency signal generation apparatus according to the first embodiment.
Figure 3:
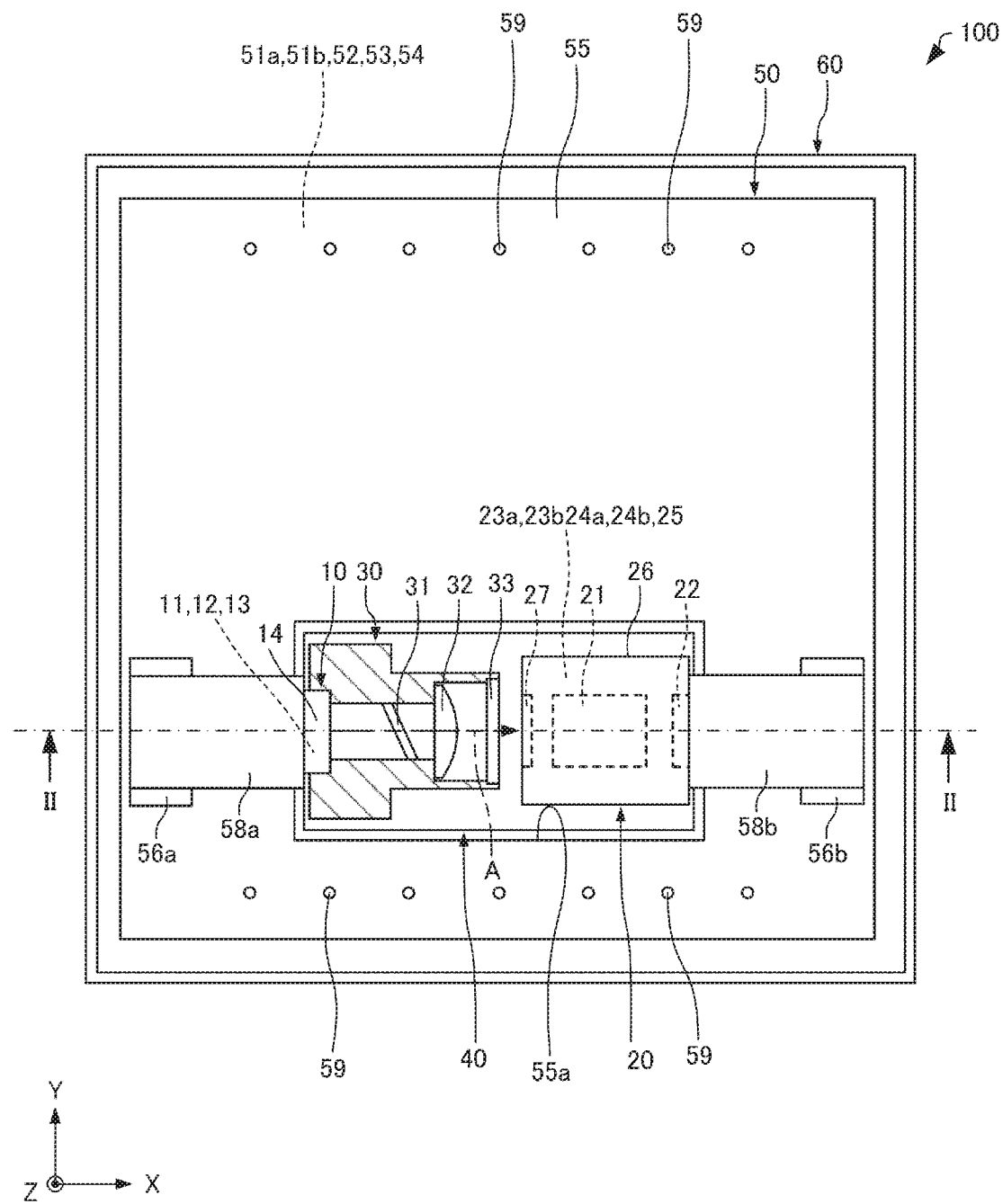
FIG. 3 is a plan view schematically showing the frequency signal generation apparatus according to the first embodiment.

FIG. 2 is a sectional view schematically showing the frequency signal generation apparatus 100. FIG. 3 is a plan view schematically showing the frequency signal generation apparatus 100. Note that FIG. 2 is the sectional view along line II-II in FIG. 3. Further, in FIGS. 2, 3, and subsequent FIGS. 4 to 6, as three axes orthogonal to one another, an X-axis, Y-axis, and Z-axis are shown. For convenience, in FIG. 3, a lid member 64 of a package 60 is omitted. Further, in FIG. 3, a holder 34 of the optical system unit 30 is shown in a sectional view cut along the XY-plane.

The frequency signal generation apparatus 100 includes the light emitting device module 10, the atom cell unit 20, the optical system unit 30, a supporting member 40 that supports the optical system unit 30, the control unit 50 electrically connected to the light emitting device module 10 and the atom cell unit 20, and a package 60 housing the parts.

Here, the Z-axis is an axis perpendicular to a placement surface 42 of the supporting member 40 and the positive direction thereof is a direction from the supporting member 40 toward the provided component. The X-axis is an axis along the light LL output from the light emitting device module 10 and the positive direction thereof is a direction in which light travels. In other words, the X-axis is an axis along the arrangement direction of the light emitting device module 10 and the atom cell unit 20, and the positive direction thereof is a direction from the light emitting device module 10 toward the atom cell unit 20. The Y-axis is an axis perpendicular to the X-axis and the Z-axis.

The light emitting device module 10 has the Peltier element 11, the light emitting device 12, the temperature sensor 13, and a package 14 housing the parts. The light emitting device 12 is e.g. a vertical cavity surface emitting laser (VCSEL). The light emitting device 12 is a light source that outputs the light LL. Hereinafter, the light emitting device 12 is also referred to as "light source 12".

The optical system unit 30 holds the light emitting device module 10. The optical system unit 30 has the dimming filter 31, the lens 32, the quarter-wave plate 33, and the holder 34 holding the parts.

A through hole 35 is provided in the holder 34. The through hole 35 is a passage region of the light LL and the dimming filter 31, the lens 32, and the quarter-wave plate 33 are sequentially placed in the through hole 35. As shown in FIG. 3, the dimming filter 31 is fixed to the holder 34 by an adhesive agent (not shown) in a position tilted relative to a plane having a normal along an optical axis A of the light LL. The lens 32 and the quarter-wave plate 33 are respectively fixed to the holder 34 by adhesive agents (not shown) in positions along the plane having the normal along the optical axis A. The light emitting device module 10 is attached to an end portion of the through hole 35 on the dimming filter 31 side (on the left side in the −X-axis direction) by an attachment member (not shown). The holder 34 is formed using e.g. a metal material such as aluminum and has heat dissipation. Thereby, heat dissipation of the light emitting device module 10 may be efficiently performed.

Note that, in the optical system unit 30, depending on the intensity, radiation angle, and the like of the light LL output from the light source 12, at least one of the dimming filter 31 and the lens 32 may be omitted. Further, the optical system unit 30 may have an optical element other than the dimming filter 31, the lens 32, or the quarter-wave plate 33. The order of the arrangement of the dimming filter 31, the lens 32, and the quarter-wave plate 33 is not limited to the order in the drawings, but arbitrary.

The atom cell unit 20 has the atom cell 21, the light receiving element 22, the temperature control elements 23a, 23b, the temperature detection elements 24a, 24b, the coil 25, a case 26 housing the parts, and a window portion 27.

The gaseous alkali metal atoms of rubidium, cesium, sodium, or the like are housed in the atom cell 21. In the atom cell 21, as desired, a rare gas of argon, neon, or the like or an inert gas of nitrogen or the like may be housed as a buffer gas with the alkali metal atoms. The detailed explanation of the atom cell 21 will be described later.

The light receiving element 22 is placed on the opposite side to the light emitting device module 10 with respect to the atom cell 21. The light receiving element 22 is not particularly limited as long as the element may detect the intensity of the light LL (resonance light pair) transmitted through the atom cell 21, but includes e.g. a photodetector such as a solar cell or photodiode.

The coil 25 is e.g. a solenoid coil wounded along the outer circumference of the atom cell 21 or a pair of Helmholtz coils opposed via the atom cell 21 (not shown). The coil 25 generates a magnetic field in a direction along (parallel to) the optical axis A of the light LL inside of the atom cell 21. Thereby, the gaps between the degenerated different energy levels of the alkali metal atoms housed in the atom cell 21 are expanded by Zeeman splitting, and resolution may be improved and the line width of the EIT signal may be made smaller. Note that the magnetic field generated by the coil 25 may be a direct-current magnetic field or alternating-current magnetic field, or a magnetic field formed by superimposition of a direct-current magnetic field and an alternating-current magnetic field.

The case 26 houses the atom cell 21, the light receiving element 22, the temperature control elements 23a, 23b, the temperature detection elements 24a, 24b, and the coil 25. The case 26 directly or indirectly supports the atom cell 21, the light receiving element 22, the temperature control elements 23a, 23b, the temperature detection elements 24a, 24b, and the coil 25. A plurality of terminals electrically connected to the light receiving element 22, the temperature control elements 23a, 23b, the temperature detection elements 24a, 24b, and the coil 25 are provided on the outer surface of the case 26. The window portion 27 having transmissivity to the light LL is provided in the case 26.

The interior of the case 26 is preferably at a lower pressure than the atmospheric pressure. Thereby, the temperature of the atom cell 21 may be controlled easily and accurately. As a result, the characteristics of the frequency signal generation apparatus 100 may be improved.

The supporting member 40 has a plate-like shape, and the atom cell unit 20 and the optical system unit 30 are mounted on the supporting member 40. The supporting member 40 has the placement surface 42 along the shape of the lower surface of the holder 34 of the optical system unit 30. A step 43 is formed on the placement surface 42. The step 43 engages with the step of the lower surface of the holder 34 to restrict movement of the holder 34 toward the atom cell unit 20 side (the side in the +X-direction). Similarly, the supporting member 40 has a placement surface 44 along the shape of the lower surface of the case 26 of the atom cell unit 20. A step 45 is formed on the placement surface 44. The step 45 engages with the end surface of the case 26 to restrict movement of the case 26 toward the optical system unit 30 side (the side in the −X-direction).

As described above, the relative position relationship between the atom cell unit 20 and the optical system unit 30 may be specified by the supporting member 40. The light emitting device module 10 is fixed to the holder 34, and thus, the relative position relationship between the atom cell unit 20 and optical system unit 30 and the light emitting device module 10 is defined. Here, the case 26 and the holder 34 are respectively fixed to the supporting member 40 by fixing members such as screws (not shown). Further, the supporting member 40 is fixed to the package 60 by fixing members such as screws (not shown). The supporting member 40 is formed using e.g. a metal material such as aluminum and has heat dissipation. Thereby, heat dissipation of the light emitting device module 10 may be efficiently performed.

As shown in FIG. 3, the control unit 50 has a circuit board 55, two connectors 56*a*, 56*b* provided on the circuit board 55, a rigid wiring board 57*a* connected to the light emitting device module 10, a rigid wiring board 57*b* connected to the atom cell unit 20, a flexible wiring board 58*a* that connects the connector 56*a* and the rigid wiring board 57*a*, a flexible wiring board 58*b* that connects the connector 56*b* and the rigid wiring board 57*b*, and a plurality of lead pins 59 penetrating the circuit board 55.

On the circuit board 55, an IC (Integrated Circuit) chip (not shown) is provided. The IC chip functions as the temperature controllers 51*a*, 51*b*, 54, the light source controller 52, and the magnetic field controller 53. A through hole 55*a* through which the supporting member 40 is inserted is provided in the circuit board 55. The circuit board 55 is supported with respect to the package 60 via the plurality of lead pins 59. The plurality of lead pins 59 respectively penetrate inside and outside of the package 60 and are electrically connected to the circuit board 55.

Note that the configuration electrically connecting the circuit board 55 and the light emitting device module 10 and the configuration electrically connecting the circuit board 55 and the atom cell unit 20 are not limited to the connectors 56*a*, 56*b*, the rigid wiring boards 57*a*, 57*b*, and the flexible wiring boards 58*a*, 58*b* shown in the drawings, but may respectively be other known connectors and wires. Or, at least part of the functions included in the IC chip may be realized by a circuit containing circuit components placed on the circuit board 55 or the like.

The package 60 houses the light emitting device module 10, the atom cell unit 20, the optical system unit 30, the supporting member 40, and the control unit 50. The package 60 has a base member 62 on which the supporting member 40 is placed and a lid member 64 placed to face the base member 62. The package 60 is formed using e.g. a metal material such as kovar and has a magnetic shielding property. Thereby, an adverse effect by an external magnetic field on the characteristics of the frequency signal generation apparatus 100 may be reduced. Note that the pressure of the interior of the package 60 may be reduced or atmospheric pressure.

1.2. Atom Cell Unit

Figure 4:
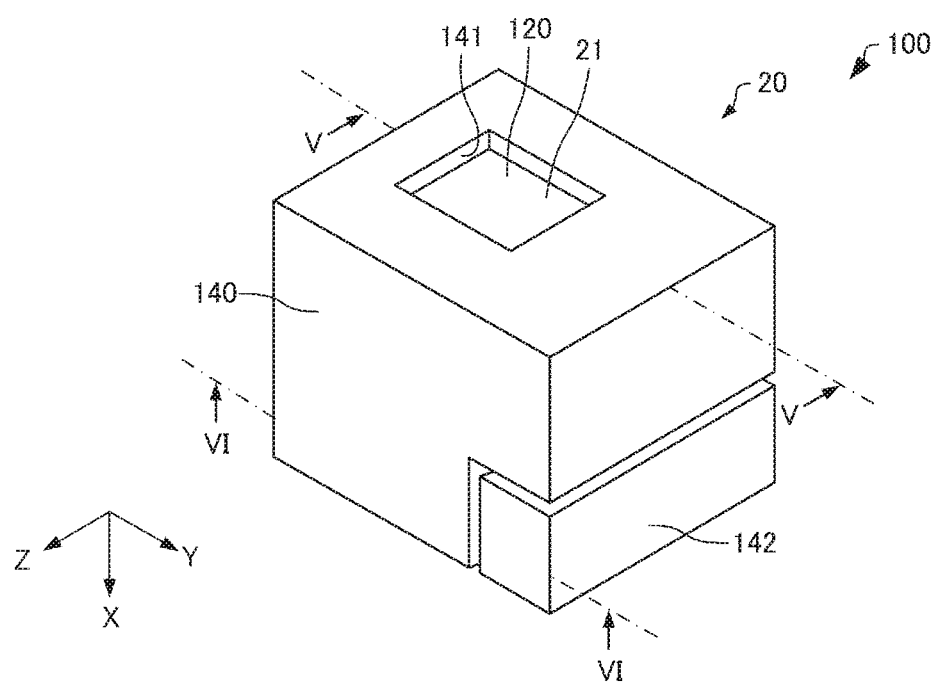
FIG. 4 is a perspective view schematically showing an atom cell unit of the frequency signal generation apparatus according to the first embodiment.
Figure 5:
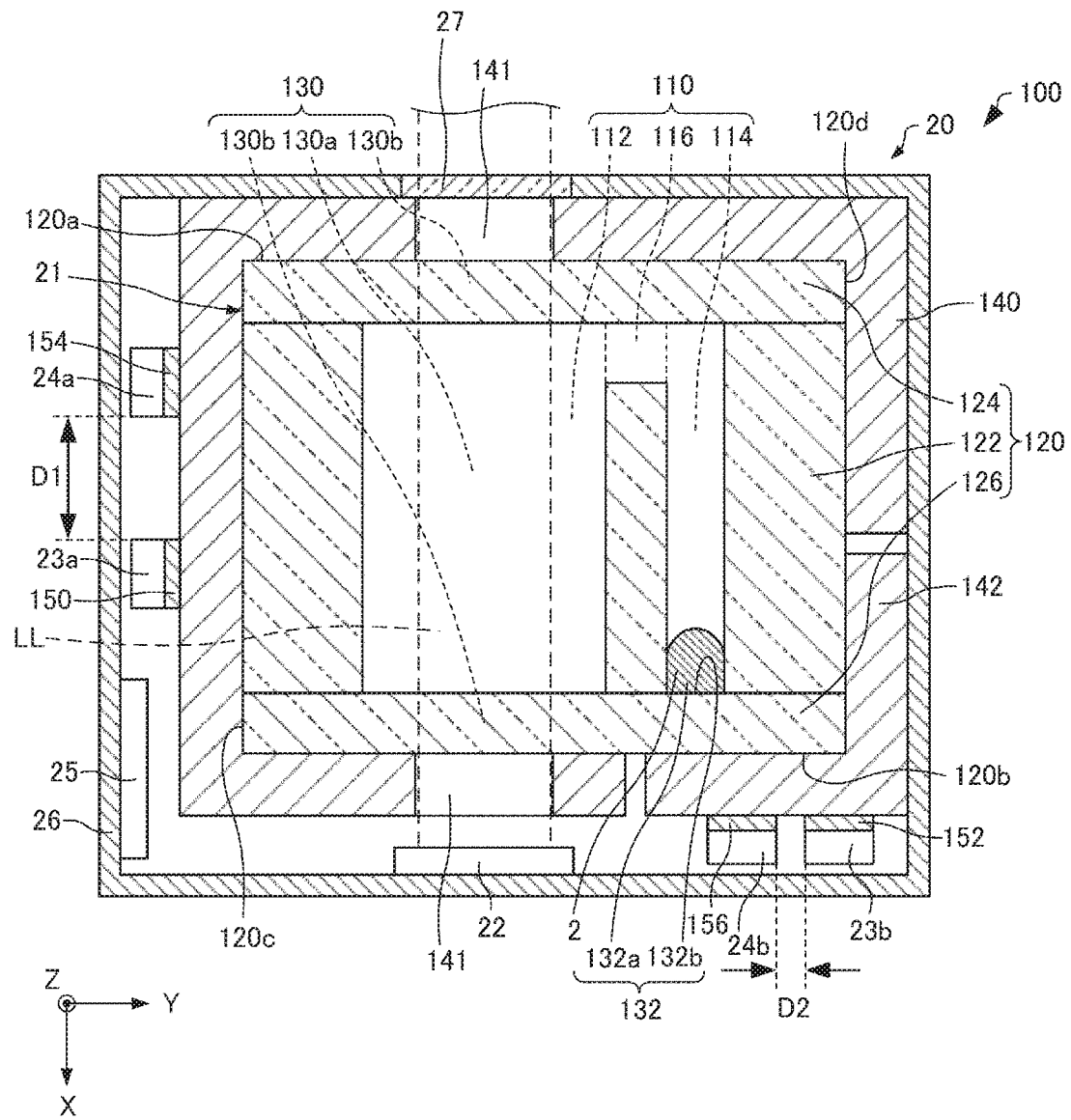
FIG. 5 is a sectional view schematically showing the atom cell unit of the frequency signal generation apparatus according to the first embodiment.
Figure 6:
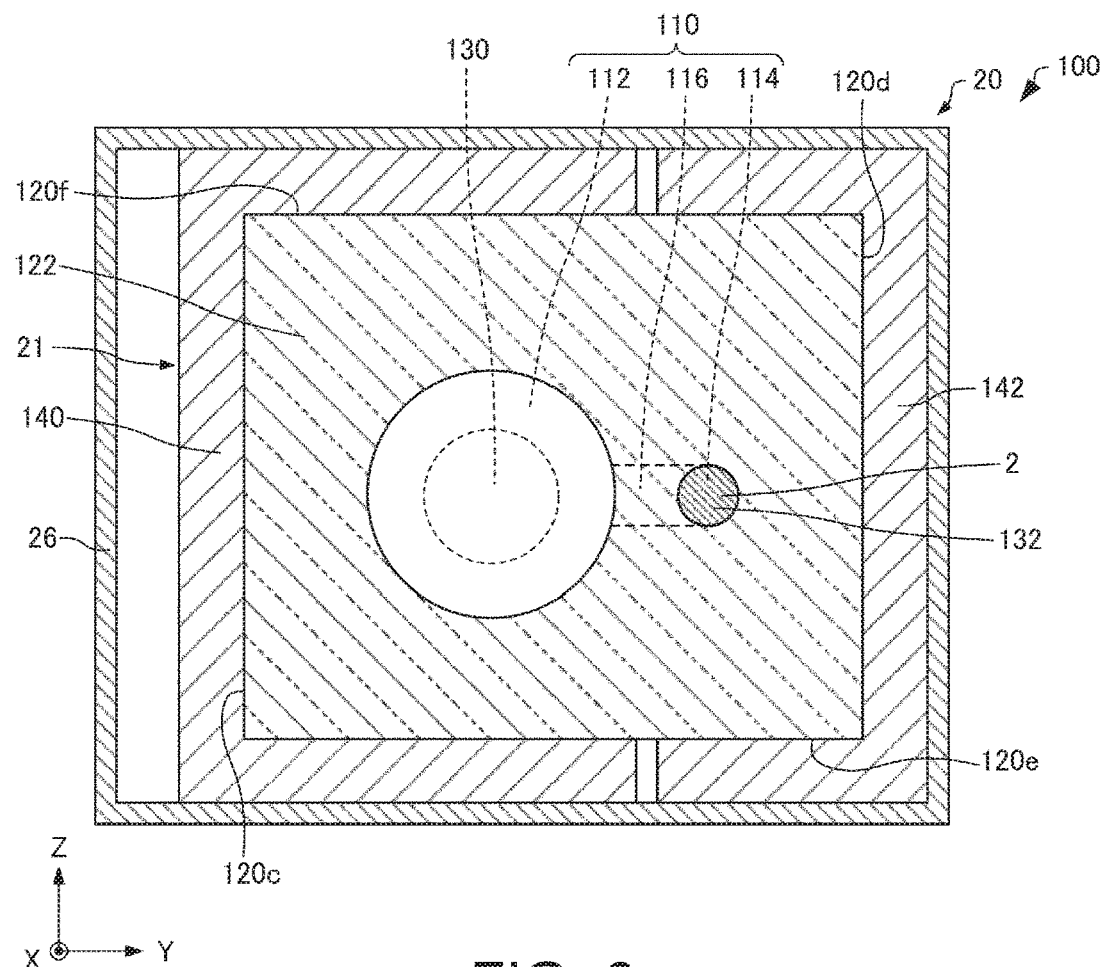
FIG. 6 is a sectional view schematically showing the atom cell unit of the frequency signal generation apparatus according to the first embodiment.

Next, the atom cell unit 20 will be explained in detail. FIG. 4 is a perspective view schematically showing the atom cell unit 20. FIG. 5 is a sectional view schematically showing the atom cell unit 20 along line V-V in FIG. 4. FIG. 6 is a sectional view schematically showing the atom cell unit 20 along line VI-VI in FIG. 4. Note that, for convenience, the case 26 and the window portion 27 are not shown in FIG. 4.

As shown in FIGS. 4 to 6, the atom cell unit 20 includes the atom cell 21, the light receiving element 22, the first temperature control element 23*a*, the second temperature control element 23*b*, the first temperature detection element 24*a*, the second temperature detection element 24*b*, the coil 25, the case 26, the window portion 27, a first member 140, a second member 142, and connection members 150, 152, 154, 156.

The size of the atom cell 21 in the X-axis directions is e.g. from 1 mm to 50 mm, preferably from 1 mm to 30 mm. As shown in FIGS. 5 and 6, the atom cell 21 includes a space 110 and a container 120. The space 110 includes a cavity 112 and a reservoir 114.

The cavity 112 is e.g. at the saturated vapor pressure of the alkali metal atom. In the example shown in the drawings, the shape of the cavity 112 is a cylindrical shape. The reservoir 114 communicates with the cavity 112 via a communication hole 116. The volume of the reservoir is smaller than the volume of the cavity 112. In the example shown in the drawings, the shape of the reservoir 114 is a cylindrical shape.

The container 120 has e.g. a rectangular parallelepiped outer shape. In the example shown in the drawings, the container 120 has a first surface 120*a*, a second surface 120*b*, a third surface 120*c*, a fourth surface 120*d*, a fifth surface 120*e*, and a sixth surface 120*f*. In the example shown in the drawings, the first surface 120*a* is a surface on the side in the −X-axis direction, the second surface 120*b* is a surface on the side in the +X-axis direction, the third surface 120*c* is a surface on the side in the −Y-axis direction, the fourth surface 120*d* is a surface on the side in the +Y-axis direction, the fifth surface 120*e* is a surface on the side in the −Z-axis direction, and the sixth surface 120*f* is a surface on the side in the +Z-axis direction.

The container 120 has a main body 122 and windows 124, 126. Two through holes are provided along the X-axis directions in the main body 122. The two through holes respectively form the cavity 112 and the reservoir 114. The windows 124, 126 are provided with the main body 122 therebetween. In the example shown in the drawings, the window 124 is joined to the surface of the main body 122 on the side in the −X-axis direction, and the window 126 is joined to the surface of the main body 122 on the side in the +X-axis direction. The shapes of the windows 124, 126 are plate-like shapes (plates). The communication hole 116 is provided in a part of the main body portion 122 located between the cavity 112 and the reservoir 114.

The material of the main body 122 is e.g. silicon, glass, or the like. The main body 122 is formed by processing of a silicon substrate or glass substrate by etching or the like. The windows 124, 126 transmit the light LL output from the light source 12. The material of the windows 124, 126 is e.g. glass.

The atom cell 21 has a first part 130 (columnar region) with the gaseous alkali metal atoms therein through which the light LL output from the light source 12 passes and a second part 132 (columnar region) with the liquid alkali metal atoms therein.

The first part 130 has a first space portion 130a and first container portions 130b. The first space portion 130a is a portion of the space 110 through which the light LL passes. In the example shown in the drawings, the cavity 112 contains the first space portion 130a. The first container portions 130b are portions of the container 120 through which the light LL passes. In the example shown in the drawings, two of the first container portions 130b are provided, and the window 124 contains one first container portion 130b and the window 126 contains the other first container portion 130b.

The second part 132 has a second space portion 132a and a second container portion 132b. The second space portion 132a is a portion of the space 110 with the liquid alkali metal atoms 2 therein. In the example shown in the drawings, the reservoir 114 contains the second space portion 132a. The second container portion 132b is a portion of the container 120 in contact with the liquid alkali metal atoms 2. In the example shown in the drawings, the second container portion 132b is a surface of the main body portion 122 in contact with the liquid alkali metal atoms 2 and a surface of the window 126 in contact with the liquid alkali metal atoms 2.

The first member 140 is placed on the container 120. The material of the first member 140 is e.g. a metal. Hereinafter, the first member 140 is also referred to as "first metal member 140". Silicon grease or heat conducting rubber (not shown) may be placed between the first metal member 140 and the container 120. The first metal member 140 is a member for transferring the heat of the first temperature control element 23a to the first part 130. The silicon grease or heat conducting rubber is placed, and thereby, air gaps between the first metal member 140 and the container 120 may be reduced and heat may be easily transferred from the first metal member 140 to the container 120.

In the example shown in the drawings, the first metal member 140 is placed on the entire surface of the first surface 120a except the portion through which the light LL passes, a part of the second surface 120b, the entire surface of the third surface 120c, a part of the fourth surface 120d, a part of the fifth surface 120e, and a part of the sixth surface 120f. The cavity 112 is located between the portion of the first metal member 140 placed on the fifth surface 120e and the portion of the first metal member 140 placed on the sixth surface 120f.

The first metal member 140 is placed to surround the first part 130. The first metal member 140 covers at least a part of the first part 130. In the example shown in the drawings, the first space portion 130a of the first part 130 is covered by the first metal member 140 placed on the surfaces 120c, 120e, 120f via the part of the cavity 112 except the first space portion 130a and the container 120. As described above, "the first metal member 140 covers the first part 130" includes the case where the first metal member 140 indirectly covers the first part 130 via the other members and spaces and the case where the first metal member 140 directly covers by being in contact with the first part 130. The same applies to "the second metal member 142 covers the second part 132".

Through holes 141 are provided in the first metal member 140. The through holes 141 penetrate the first metal member 140 in the X-axis directions. Two of the through holes 141 are provided. The two through holes 141 are respectively provided in locations overlapping with the portions of the first surface 120a and the second surface 120b through which the light LL passes. Note that members (not shown) through which the light LL is transmitted may be provided in the through holes 141.

The second member 142 is placed on the container 120. The material of the second member 142 is e.g. a metal. Hereinafter, the second member 142 is also referred to as "second metal member 142". Silicon grease or heat conducting rubber (not shown) may be placed between the second metal member 142 and the container 120. The second metal member 142 is a member for transferring the heat of the second temperature control element 23b to the second part 132. The silicon grease or heat conducting rubber is placed, and thereby, air gaps between the second metal member 142 and the container 120 may be reduced and heat may be easily transferred from the second metal member 142 to the container 120.

In the example shown in the drawings, the second metal member 142 is placed on a part of the second surface 120b, a part of the fourth surface 120d, a part of the fifth surface 120e, and a part of the sixth surface 120f. The second part 132 is located between the portion of the second metal member 142 placed on the fifth surface 120e and the portion of the second metal member 142 placed on the sixth surface 120f.

The second metal member 142 is placed to surround the second part 132. The second metal member 142 covers at least a part of the second part 132. In the example shown in the drawings, the second part 132 is covered by the second metal member 142 via the container 120.

The second metal member 142 is separated from the first metal member 140. An air gap is provided between the first metal member 140 and the second metal member 142. The distance between the first metal member 140 and the second metal member 142 is e.g. from 0.1 mm to 3 mm, preferably from 0.1 mm to 1 mm.

The materials of the first metal member 140 and the second metal member 142 are both aluminum. Note that the materials of the metal members 140, 142 are not limited to aluminum, but may be e.g. copper, brass, or the like.

The first temperature control element 23a is placed on the first metal member 140. In the example shown in the drawings, the first temperature control element 23a is connected to the first metal member 140 by the connection member 150. The first temperature control element 23a is thermally connected to the first metal member 140 by the connection member 150. That is, the heat of the first temperature control element 23a is transferred to the connection member 150 and transferred to the first metal member 140. The first temperature control element 23a may be joined to the first metal member 140 by the connection member 150. In the example shown in the drawings, the first temperature control element 23a is provided on the surface of the first metal member 140 on the side in the −Y-axis direction.

The first temperature control element 23a controls the temperature of the first part 130. Specifically, the first temperature control element 23a generates heat according to a signal from the first temperature controller 51a based on the output of the first temperature detection element 24a to control the temperature of the first part 130.

The second temperature control element 23b is placed on the second metal member 142. In the example shown in the drawings, the second temperature control element 23b is connected to the second metal member 142 by the connection member 152. The second temperature control element 23b is thermally connected to the second metal member 142 by the connection member 152. That is, the heat of the second temperature control element 23*b* is transferred to the connection member 152 and transferred to the second metal member 142. The second temperature control element 23*b* may be joined to the second metal member 142 by the connection member 152. In the example shown in the drawings, the second temperature control element 23*b* is provided on the surface of the second metal member 142 on the side in the +X-axis direction.

The second temperature control element 23*b* controls the temperature of the second part 132 to a temperature lower than the temperature of the first part 130. Specifically, the second temperature control element 23*b* generates heat according to a signal from the second temperature controller 51*b* based on the output of the second temperature detection element 24*b* to control the temperature of the second part 132 to the temperature lower than the temperature of the first part 130.

Both the first temperature control element 23*a* and the second temperature control element 23*b* are heaters and may have the same characteristics in temperature control, for example. Note that the temperature control elements 23*a*, 23*b* are not limited to the heaters, but may be e.g. Peltier elements.

The first temperature detection element 24*a* is placed on the first metal member 140. In the example shown in the drawings, the first temperature detection element 24*a* is connected to the first metal member 140 by the connection member 154. The first temperature detection element 24*a* is thermally connected to the first metal member 140 by the connection member 154. That is, the heat of the first metal member 140 is transferred to the connection member 154 and transferred to the first temperature detection element 24*a*. The first temperature detection element 24*a* may be joined to the first metal member 140 by the connection member 154. In the example shown in the drawings, the first temperature detection element 24*a* is provided on the surface of the first metal member 140 on the side in the −Y-axis direction.

The first temperature detection element 24*a* detects the temperature of the first part 130. Regarding the temperature detection, the first temperature detection element 24*a* may directly measure the temperature of the first part 130, or the first temperature detection element 24*a* may indirectly measure the temperature of the first part 130 via another member or the like. For example, even in the case where there is a difference between the temperature directly detected by the first temperature detection element 24*a* and the temperature of the first part 130, the difference is measured in advance, and thereby, the first temperature detection element 24*a* may indirectly estimate the temperature of the first part 130 from the temperature directly detected by the first temperature detection element 24*a*. The indirect temperature detection may be applied to the detection of the temperature of the second part 132 by the second temperature detection element 24*b*. Or, the first temperature control element 23*a* and the second temperature control element 23*b* may be controlled on the assumption that there are differences between the temperatures.

The second temperature detection element 24*b* is placed on the second metal member 142. In the example shown in the drawings, the second temperature detection element 24*b* is connected to the second metal member 142 by the connection member 156. The second temperature detection element 24*b* is thermally connected to the second metal member 142 by the connection member 156. That is, the heat of the second metal member 142 is transferred to the connection member 156 and transferred to the second temperature detection element 24*b*. The second temperature detection element 24*b* may be joined to the second metal member 142 by the connection member 156. In the example shown in the drawings, the second temperature detection element 24*b* is provided on the surface of the second metal member 142 on the side in the +X-axis direction. The second temperature detection element 24*b* detects the temperature of the second part 132. The connection members 150, 152, 154, 156 are e.g. silicon grease.

Both the first temperature detection element 24*a* and the second temperature detection element 24*b* are thermistors and may have the same characteristics in temperature detection, for example. Note that the temperature detection elements 24*a*, 24*b* are not limited to the thermistors, but may be thermocouples.

A distance D1 between the first temperature control element 23*a* and the first temperature detection element 24*a* and a distance D2 between the second temperature control element 23*b* and the second temperature detection element 24*b* are different. The distance D1 is the shortest distance between the first temperature control element 23*a* and the first temperature detection element 24*a*. The distance D2 is the shortest distance between the second temperature control element 23*b* and the second temperature detection element 24*b*. In the example shown in the drawings, the distance D2 is smaller than the distance D1. For example, a shortest path K1 from the first temperature control element 23*a* through the connection member 150, the outer surface of the first metal member 140, and the connection member 154 to the first temperature detection element 24*a* and a shortest path K2 from the second temperature control element 23*b* through the connection member 152, the outer surface of the second metal member 142, and the connection member 156 to the second temperature detection element 24*b* are different. The shortest path K2 is smaller than the shortest path K1.

Note that, as another example, the distance D1 may be made smaller than the distance D2. In this case, the time until the heat generated by the first temperature control element 23*a* is transferred to the first temperature detection element 24*a* is shorter than the time until the heat generated by the second temperature control element 23*b* is transferred to the second temperature detection element 24*b*. Therefore, in the frequency signal generation apparatus 100, the first part 130 may be kept at a higher temperature than that of the second part faster than the second part 132. Thereby, for example, the alkali metal atoms may be made hard to be precipitated relatively in the first part 130 of the first part 130 and the second part 132. Therefore, precipitation of the alkali metal atoms in the first part 130 may be suppressed.

The first temperature control element 23*a* and the first temperature detection element 24*a* are thermally connected. The second temperature control element 23*b* and the second temperature detection element 24*b* are thermally connected. The first temperature control element 23*a* and the second temperature detection element 24*b* are thermally connected. The second temperature control element 23*b* and the first temperature detection element 24*a* are thermally connected. Here, "the temperature control element and the temperature detection element are thermally connected" means that the temperature change generated in temperature control by the temperature control element in a location where the temperature detection element detects the temperature is equal to or more than the resolution of the temperature detection element. As described above, the size of the atom cell 21 in the X-axis directions is as small as from 1 mm to 50 mm and the distance between the first metal member 140 and the second metal member 142 is as small as from 0.1 mm to 3 mm. Accordingly, even when the first metal member 140 and the second metal member 142 are separated, for example, the heat generated by the first temperature control element 23a is transferred to the air gap between the metal members 140, 142, the container 120, the case 26, and the like and transferred to the second temperature detection element 24b.

The case 26 houses the atom cell 21, the light receiving element 22, the temperature control elements 23a, 23b, the temperature detection elements 24a, 24b, the metal members 140, 142, and the connection members 150, 152, 154, 156. In the example shown in the drawings, the case 26 is in contact with the metal members 140, 142, however, another member may be provided between the case 26 and the metal members 140, 142. Note that the location of the coil 25 is not particularly limited.

The material of the case 26 is e.g. an Fe—Ni alloy such as kovar or permalloy. The case 26 has a magnetic shielding property and may block the alkali metal atoms within the atom cell 21 from an external magnetic field. Thereby, stability of the magnetic field of the coil 25 within the case 26 may be improved.

Note that, when the temperature control elements 23a, 23b generate magnetic fields, the influence of the magnetic fields may be reduced by collector surfaces of transistors, containers formed using materials having magnetic shielding properties and housing the temperature control elements 23a, 23b, or the containers with nichrome wires circularly wound around the containers. Note that, as the material of the containers housing the temperature control elements 23a, 23b, the same material as that of the case 26 may be used.

The through hole is provided in the case 26 and the window portion 27 is provided in the through hole. The window portion 27 transmits the light LL. The material of the window portion 27 is e.g. glass.

Figure 7:
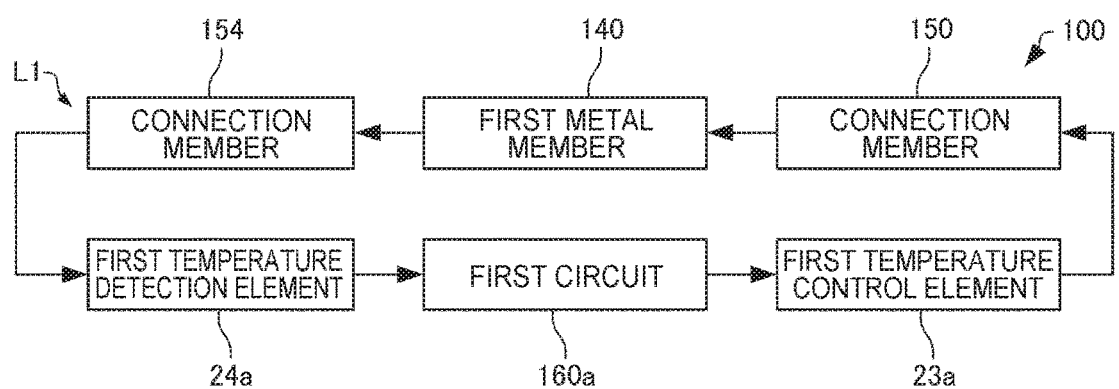
FIG. 7 is a functional block diagram of a temperature control loop of a first part of the frequency signal generation apparatus according to the first embodiment.

Here, FIG. 7 is a functional block diagram of a temperature control loop L1 of the first part 130. As shown in FIG. 7, the temperature control loop L1 includes e.g. the first temperature detection element 24a, a first circuit 160a, and the first temperature control element 23a. The first circuit 160a outputs a signal according to the output of the first temperature detection element 24a to the first temperature control element 23a. The first temperature control element 23a generates heat according to the signal from the first circuit 160a. The heat generated from the first temperature control element 23a is transferred to the connection member 150, the first metal member 140, and the connection member 154 and transferred to the first temperature detection element 24a. The first temperature detection element 24a outputs a signal according to the heat generated by the first temperature control element 23a to the first circuit 160a again. As described above, the temperature control loop L1 forms a feedback loop. As described above, for example, the temperature control loop L1 includes the first metal member 140 and the connection members 150, 154 as a path of the heat generated from the first temperature control element 23a.

Figure 8:
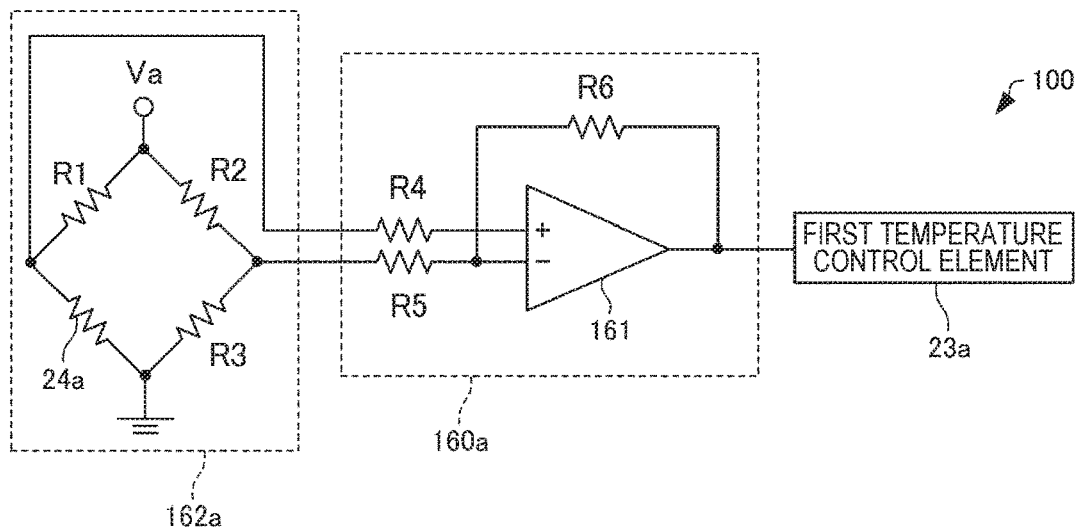
FIG. 8 is a circuit diagram for explanation of a first temperature detection element and a first circuit of the frequency signal generation apparatus according to the first embodiment.

FIG. 8 is a circuit diagram for explanation of the first temperature detection element 24a and the first circuit 160a. The explanation will be made below with the temperature detection elements 24a, 24b as thermistors. As shown in FIG. 8, the first temperature detection element 24a forms a temperature detection circuit 162a with resistors R1, R2, R3. The temperature detection circuit 162a is a bridge circuit. The first temperature detection element 24a has a resistance that changes according to a surrounding temperature. The temperature detection circuit 162a converts the temperature change surrounding the first temperature detection element 24a into a voltage and outputs the voltage to the first circuit 160a. A power supply voltage Va is e.g. 3.3 V.

The first circuit 160a includes an operational amplifier 161 and resistors R4, R5, R6. The first circuit 160a is an inverting amplifier circuit. A gain G of the first circuit 160a is expressed by G=R6/R4. The first circuit 160a inverts and amplifies the polarity of the voltage from the temperature detection circuit 162a, and outputs a signal (e.g. current) to the first temperature control element 23a. Note that, for example, the first temperature controller 51a may include the other components than the first circuit 160a and the first temperature detection element 24a of the temperature detection circuit 162a.

Figure 9:
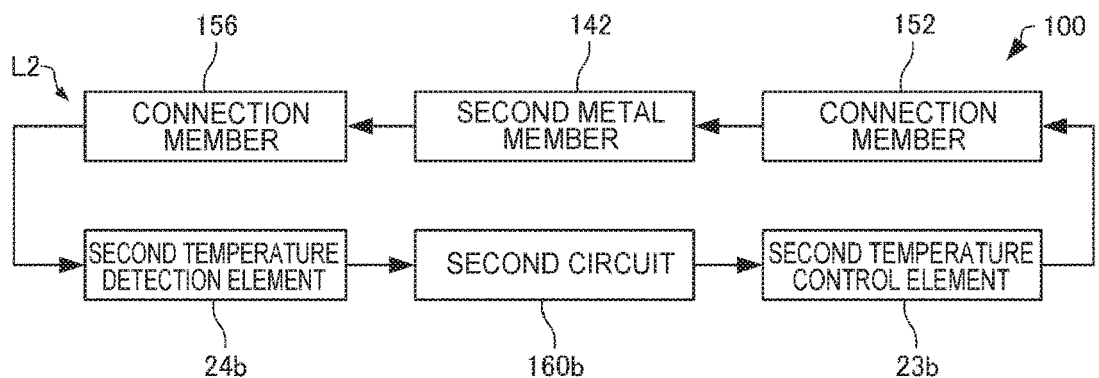
FIG. 9 is a functional block diagram of a temperature control loop of a second part of the frequency signal generation apparatus according to the first embodiment.

FIG. 9 is a functional block diagram of a temperature control loop L2 of the second part 132. As shown in FIG. 9, the temperature control loop L2 includes e.g. the second temperature detection element 24b, a second circuit 160b, and the second temperature control element 23b. The second circuit 160b outputs a signal according to the output of the second temperature detection element 24b to the second temperature control element 23b. The second temperature control element 23b generates heat according to the signal from the second circuit 160b. The heat generated from the second temperature control element 23b is transferred to the connection member 152, the second metal member 142, and the connection member 156 and transferred to the second temperature detection element 24b. The second temperature detection element 24b outputs a signal according to the heat generated by the second temperature control element 23b to the second circuit 160b again. As described above, the temperature control loop L2 forms a feedback loop. As described above, for example, the temperature control loop L2 includes the second metal member 142 and the connection members 152, 156 as a path of the heat generated from the second temperature control element 23b.

The second temperature detection element 24b and the second circuit 160b form e.g. the same circuit as that of the circuit diagram shown in FIG. 8. For example, the second temperature controller 51b may include the other components than the second circuit 160b and the second temperature detection element 24b.

Figure 10:
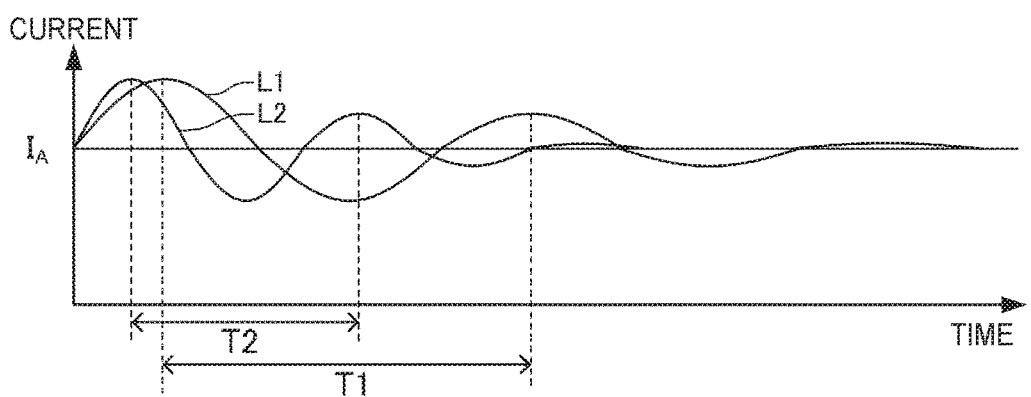
FIG. 10 is a diagram for explanation of phase of the temperature control loops of the first part and the second part of the frequency signal generation apparatus according to the first embodiment.

FIG. 10 is a diagram for explanation of phase of the temperature control loops L1, L2. In FIG. 10, the horizontal axis indicates time and the vertical axis indicates magnitude of currents as signals input to the temperature control elements 23a, 23b. In the temperature control loops L1, L2, as shown in FIG. 10, for example, overshoot is repeated, and then, a steady current IA is supplied to the temperature control elements 23a, 23b. Note that, in FIG. 10, the case where gain of the first circuit 160a and gain of the second circuit 160b are the same is shown.

As described above, the distance D1 between the first temperature control element 23a and the first temperature detection element 24a and the distance D2 between the second temperature control element 23b and the second temperature detection element 24b are different. Specifically, the distance D2 is smaller than the distance D1. Accordingly, the time until the temperature change generated in temperature control by the second temperature control element 23b is transferred to the second temperature detection element 24b is shorter than the time until the temperature change generated in temperature control by the first temperature control element 23a is transferred to the first temperature detection element 24a. For example, the time until the heat generated by the second temperature control element 23b is transferred to the second temperature detection element 24b is shorter than the time until the heat generated by the first temperature control element 23a is transferred to the first temperature detection element 24a. Therefore, as shown in FIG. 10, when overshoot is repeated, for example, a period T2 of the signal input to the second temperature control element 23b is shorter than a period T1 of the signal input to the first temperature control element 23a. That is, the phase of the signal input to the first temperature control element 23a and the phase of the signal input to the second temperature control element 23b are different. In other words, the phase of the temperature control loop L1 and the phase of the temperature control loop L2 are different. Note that, in this specification, the example with overshoot is shown for explanation, however, the same advantage may be obtained in the case with less overshoot or the case substantially with no overshoot.

The frequency signal generation apparatus 100 has the following features, for example.

In the frequency signal generation apparatus 100, the phase of the temperature control loop L1 of the first part 130 and the phase of the temperature control loop L2 of the second part 132 are different. Accordingly, in the frequency signal generation apparatus 100, even when the first temperature control element 23a and the second temperature detection element 24b are thermally connected and the second temperature control element 23b and the first temperature detection element 24a are thermally connected, interference of the temperature control loop L1 and the temperature control loop L2 with each other may be further suppressed compared to the case where the phase of the temperature control loop L1 of the first part and the phase of the temperature control loop L2 of the second part are the same, and the first part 130 and the second part 132 may be independently controlled. Therefore, in the frequency signal generation apparatus 100, instability of the temperature of the atom cell 21 may be suppressed and, for example, the temperature of the atom cell 21 may be kept at a desired value. Accordingly, in the frequency signal generation apparatus 100, a transmissivity change of the light LL due to precipitation and formation of films of the alkali metal atoms in the first container portions 130b of the atom cell 21 through which the light LL passes may be suppressed. As a result, in the frequency signal generation apparatus 100, frequency stability may be improved.

For example, if the phase of the temperature control loop L1 and the phase of the temperature control loop L2 are the same, the temperature control loops L1, L2 may interfere with each other. Then, oscillation of the temperature or the like occurs and the temperature is harder to be converged to a desired temperature, and the temperature of the atom cell 21 may be harder to be kept at a desired value.

Further, in the frequency signal generation apparatus 100, the first part 130 and the second part 132 may be independently controlled without a large heat-retaining tube, and thereby, the apparatus may be downsized. Even when the distance between the first part 130 and the second part 132 is not made sufficiently large, instability of the temperature of the atom cell 21 may be suppressed, and thereby, the frequency signal generation apparatus 100 may be downsized.

In the frequency signal generation apparatus 100, the distance D1 between the first temperature control element 23a and the first temperature detection element 24a and the distance D2 between the second temperature control element 23b and the second temperature detection element 24b are different. Accordingly, in the frequency signal generation apparatus 100, the time until the temperature change generated in temperature control by the first temperature control element 23a is transferred to the first temperature detection element 24a and the time until the temperature change generated in temperature control by the second temperature control element 23b is transferred to the second temperature detection element 24b are different. For example, the time until the heat generated by the first temperature control element 23a is transferred to the first temperature detection element 24a and the time until the heat generated by the second temperature control element 23b is transferred to the second temperature detection element 24b are different. Thereby, in the frequency signal generation apparatus 100, the phase of the temperature control loop L1 and the phase of the temperature control loop L2 may be made different.

In the frequency signal generation apparatus 100, the distance D2 is smaller than the distance D1. Accordingly, in the frequency signal generation apparatus 100, the time until the heat generated by the second temperature control element 23b is transferred to the second temperature detection element 24b is shorter than the time until the heat generated by the first temperature control element 23a is transferred to the first temperature detection element 24a. Therefore, in the frequency signal generation apparatus 100, the second part 132 may be converged to a desired temperature faster than the first part 130. The first part 130 reaches a higher temperature than that of the second part 132 after the second part 132 reaches the desired temperature. Thereby, for example, the vapor pressure of the gaseous alkali metal atoms in the first part 130 may be stabilized and the excessive alkali metal atoms may be precipitated in the vicinity of the second part 132, and thus, precipitation of the alkali metal atoms in the first part 130 may be suppressed.

In the frequency signal generation apparatus 100, the first metal member 140 covering at least apart of the first part 130 and the second metal member 142 separated from the first metal member 140 and covering at least apart of the second part 132 are provided. Accordingly, in the frequency signal generation apparatus 100, the temperature of the first part 130 may be stabilized more easily than that in the case without the first metal member 140, and the temperature of the second part 132 may be stabilized more easily than that in the case without the second metal member 142. Further, the first metal member 140 and the second metal member 142 are separated, and thereby, heat transfer between the first metal member 140 and the second metal member 142 may be suppressed and instability of the temperature of the atom cell 21 may be suppressed.

Note that the atom cell according to the invention does not necessarily include the reservoir 114 and communication hole 116 (not shown). In other words, the structure that partitions the cavity 112 and the reservoir 114 of the main body portion 122 is not necessarily provided.

Further, the frequency signal generation apparatus according to the invention may include three or more temperature control elements and three or more temperature detection elements (not shown). For example, two of the temperature control elements that control the temperature of the first part 130 and the temperature detection elements that detect the temperature of the first part 130 are respectively provided, and thereby, the temperature of the first part 130 may be controlled more accurately.

2. Second Embodiment 2.1. Frequency Signal Generation Apparatus

Figure 11:
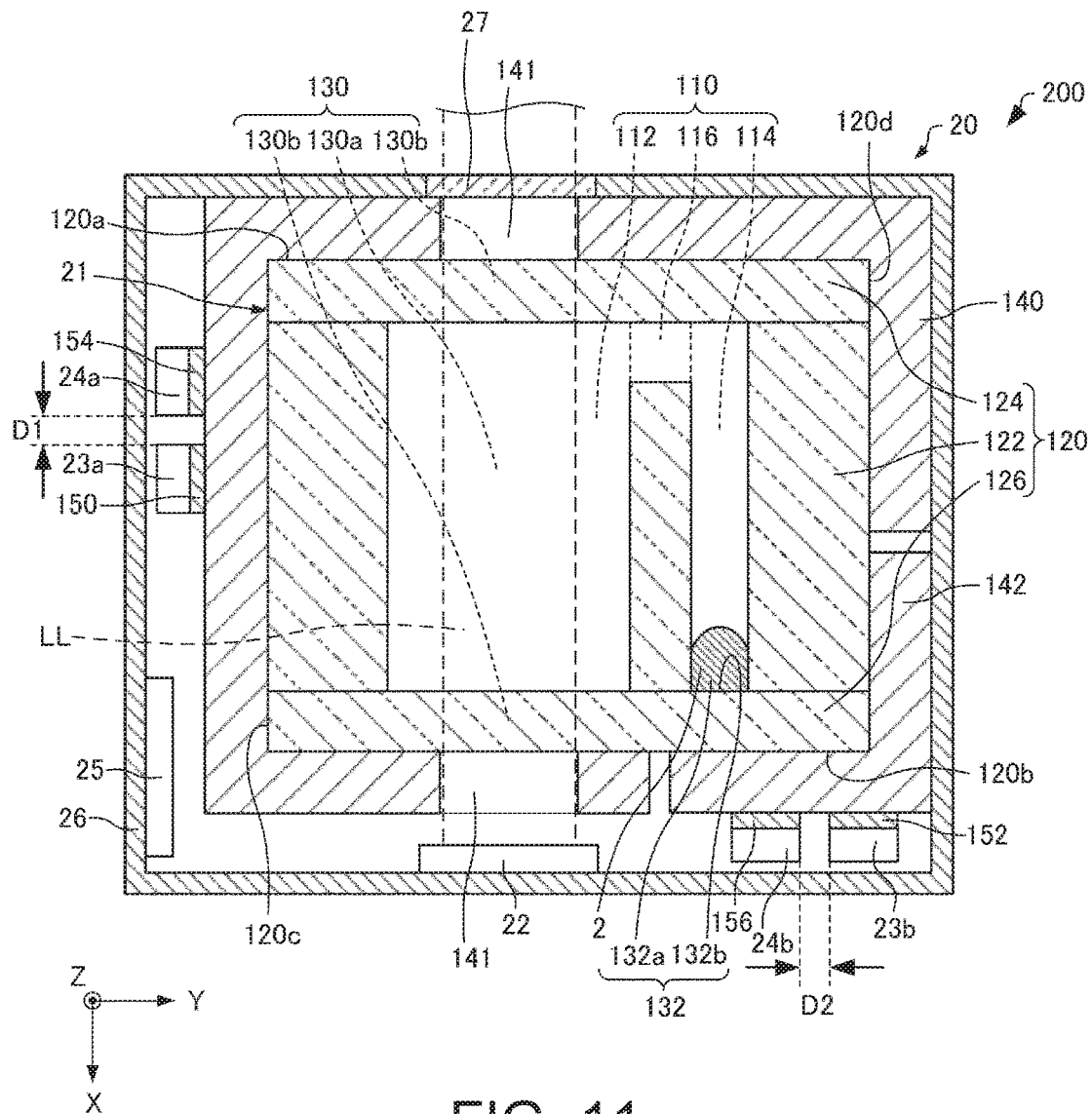
FIG. 11 is a sectional view schematically showing an atom cell unit of a frequency signal generation apparatus according to the second embodiment.

Next, a frequency signal generation apparatus according to the second embodiment will be explained with reference to the drawings. FIG. 11 is a sectional view schematically showing an atom cell unit 20 of a frequency signal generation apparatus 200 according to the second embodiment. Note that, in FIG. 11, as three axes orthogonal to one another, an X-axis, Y-axis, and Z-axis are shown.

In the frequency signal generation apparatus 200 according to the second embodiment, differences from the example of the above described frequency signal generation apparatus 100 will be explained below, and the explanation of the same configurations will be omitted.

In the above described frequency signal generation apparatus 100, as shown in FIG. 5, the distance D1 between the first temperature control element 23a and the first temperature detection element 24a and the distance D2 between the second temperature control element 23b and the second temperature detection element 24b are different. On the other hand, in the frequency signal generation apparatus 200, the distance D1 and the distance D2 are the same.

In the frequency signal generation apparatus 200, the thermal conductivity of the first metal member 140 and the thermal conductivity of the second metal member 142 may be different. Accordingly, in the frequency signal generation apparatus 200, a first time until the temperature change generated in temperature control by the first temperature control element 23a is transferred to the first temperature detection element 24a and a second time until the temperature change generated in temperature control by the second temperature control element 23b is transferred to the second temperature detection element 24b may be made different. Thereby, in the frequency signal generation apparatus 200, the phase of the temperature control loop L1 and the phase of the temperature control loop L2 may be made different. For example, the material of the first metal member 140 is permalloy and the material of the second metal member 142 is aluminum.

In the frequency signal generation apparatus 200, the thermal conductivity of the connection member 150 and the thermal conductivity of the connection member 152 may be different. Thereby, in the frequency signal generation apparatus 200, the first time and the second time may be made different, and the phase of the temperature control loop L1 and the phase of the temperature control loop L2 may be made different. For example, the materials of the connection members 150, 152 are made different, and thereby, the thermal conductivities of the connection members 150, 152 may be made different. For example, the thermal conductivity of the connection member 152 is higher than the thermal conductivity of the connection member 150. As the material of the connection member 150, at least one material of e.g. aluminum, brass, permalloy, silicon grease, heat conducting rubber, and the like may be used. As the material of the connection member 152, at least one material having a different thermal conductivity from that of the material used for the connection member 150 of the same materials of the materials of the connection member 150 may be used. Or, as the materials of the connection member 150 and the connection member 152, materials having the same quality and different thermal conductivities, e.g. silicon grease having a higher thermal conductivity and silicon grease having a lower thermal conductivity may be respectively selected.

In the frequency signal generation apparatus 200, the thermal conductivity of the connection member 154 and the thermal conductivity of the connection member 156 may be different. Thereby, in the frequency signal generation apparatus 200, the first time and the second time may be made different, and the phase of the temperature control loop L1 and the phase of the temperature control loop L2 may be made different. For example, the materials of the connection members 154, 156 are made different, and thereby, the thermal conductivities of the connection members 154, 156 may be made different. For example, the thermal conductivity of the connection member 156 is higher than the thermal conductivity of the connection member 154. As the material of the connection member 154, at least one material of e.g. aluminum, brass, permalloy, silicon grease, heat conducting rubber, and the like may be used. As the material of the connection member 156, at least one material having a different thermal conductivity from that of the material used for the connection member 154 of the same materials of the materials of the connection member 154 may be used. Or, as the materials of the connection member 154 and the connection member 156, materials having the same quality and different thermal conductivities, e.g. silicon grease having a higher thermal conductivity and silicon grease having a lower thermal conductivity may be respectively selected.

As described above, in the frequency signal generation apparatus 200, one or more of the following first condition, second condition, and third condition are fulfilled, and thereby, the phase of the temperature control loop L1 and the phase of the temperature control loop L2 may be made different.

First Condition: Thermal conductivities of the metal members 140, 142 are different.
Second Condition: Thermal conductivities of the connection members 150, 152 are different.
Third Condition: Thermal conductivities of the connection members 154, 156 are different.

Note that the thermal conductivities of the respective members 140, 142, 150, 152, 154, 156 are determined by the materials of the respective members 140, 142, 150, 152, 154, 156.

If the phase of the temperature control loop L1 and the phase of the temperature control loop L2 are different, in the above described frequency signal generation apparatus 100, one or more of the first condition, the second condition, and the third condition may be fulfilled.

In any one of the first condition, the second condition, and the third condition, if the thermal conductivity of one is different from the thermal conductivity of the other, even when one of the thermal conductivities is higher, interference of the temperature control loop L1 and the temperature control loop L2 may be suppressed. Note that, in any one of the first condition, the second condition, and the third condition, the thermal conductivity of the member corresponding to the second part 132, i.e., the metal member 142, the connection member 152, or the connection member 156 is higher than the thermal conductivity of the member corresponding to the first part 130, i.e., the metal member 140, the connection member 150, or the connection member 154, and thereby, the temperature of the second part 132 may be stabilized faster.

2.2. Modified Example of Frequency Signal Generation Apparatus

Next, a frequency signal generation apparatus according to a modified example of the second embodiment will be explained. In the frequency signal generation apparatus according to the modified example of the second embodiment, differences from the example of the above described frequency signal generation apparatus 200 will be explained below and the explanation of the same configurations will be omitted.

In the above described frequency signal generation apparatus 200, one or more of the first condition, the second condition, and the third condition are fulfilled. On the other hand, in the frequency signal generation apparatus according to the modified example, the gain of the first circuit 160a and the gain of the second circuit 160b are different. Thereby, in the frequency signal generation apparatus according to the modified example, the phase of the temperature control loop L1 and the phase of the temperature control loop L2 may be made different.

Figure 12:
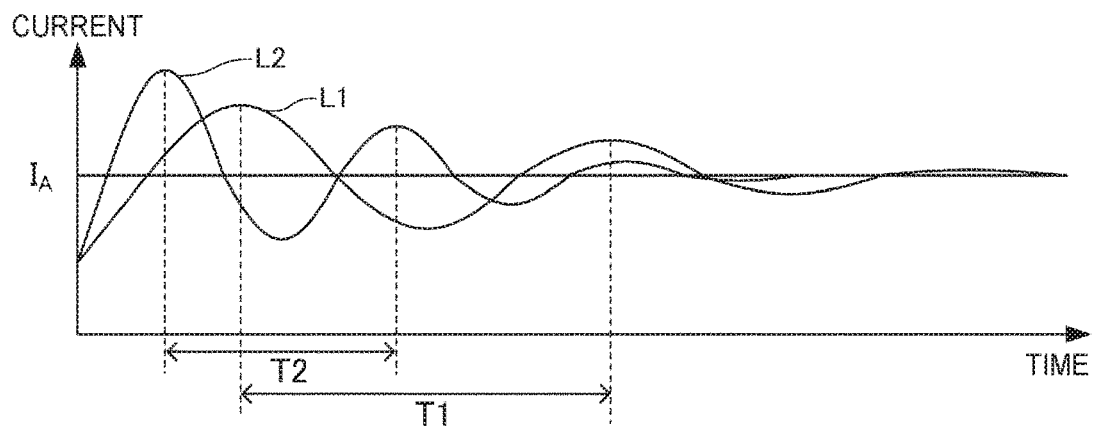
FIG. 12 is a diagram for explanation of phase of temperature control loops of a first part and a second part of a frequency signal generation apparatus according to a modified example of the second embodiment.

For example, if the gain of the second circuit 160b is larger than the gain of the first circuit 160a, the intensity of the signal according to the output of the second temperature detection element 24b may be made higher than the intensity of the signal according to the output of the first temperature detection element 24a, and the intensity of the signal input to the second temperature control element 23b may be made higher than the intensity of the signal input to the first temperature control element 23a. Accordingly, the response speed of the second temperature control element 23b to the output of the second temperature detection element 24b may be made faster than the response speed of the first temperature control element 23a to the output of the first temperature detection element 24a. Therefore, as shown in FIG. 12, when overshoot is repeated, for example, a period T2 of the signal input to the second temperature control element 23b is shorter than a period T1 of the signal input to the first temperature control element 23a. That is, the phase of the temperature control loop L1 and the phase of the temperature control loop L2 are different.

Note that the gain of the first circuit 160a may be made larger than the gain of the second circuit 160b. In this case, the response speed of the first temperature control element 23a to the output of the first temperature detection element 24a may be made faster than the response speed of the second temperature control element 23b to the output of the second temperature detection element 24b. Therefore, in the frequency signal generation apparatus according to the modified example, the first part 130 may be kept faster than the second part 132 at a higher temperature than that of the second part 132. Thereby, for example, the alkali metal atoms may be made harder to be precipitated in the first part 130 of the first part 130 and the second part 132. Therefore, precipitation of the alkali metal atoms in the first part 130 may be suppressed.

Note that, if the phase of the temperature control loop L1 and the phase of the temperature control loop L2 are different, in the above described frequency signal generation apparatus 100, the gain of the first circuit 160a and the gain of the second circuit 160b may be different and, in the above described frequency signal generation apparatus 200, the gain of the first circuit 160a and the gain of the second circuit 160b may be different.

3. Third Embodiment

Figure 13:
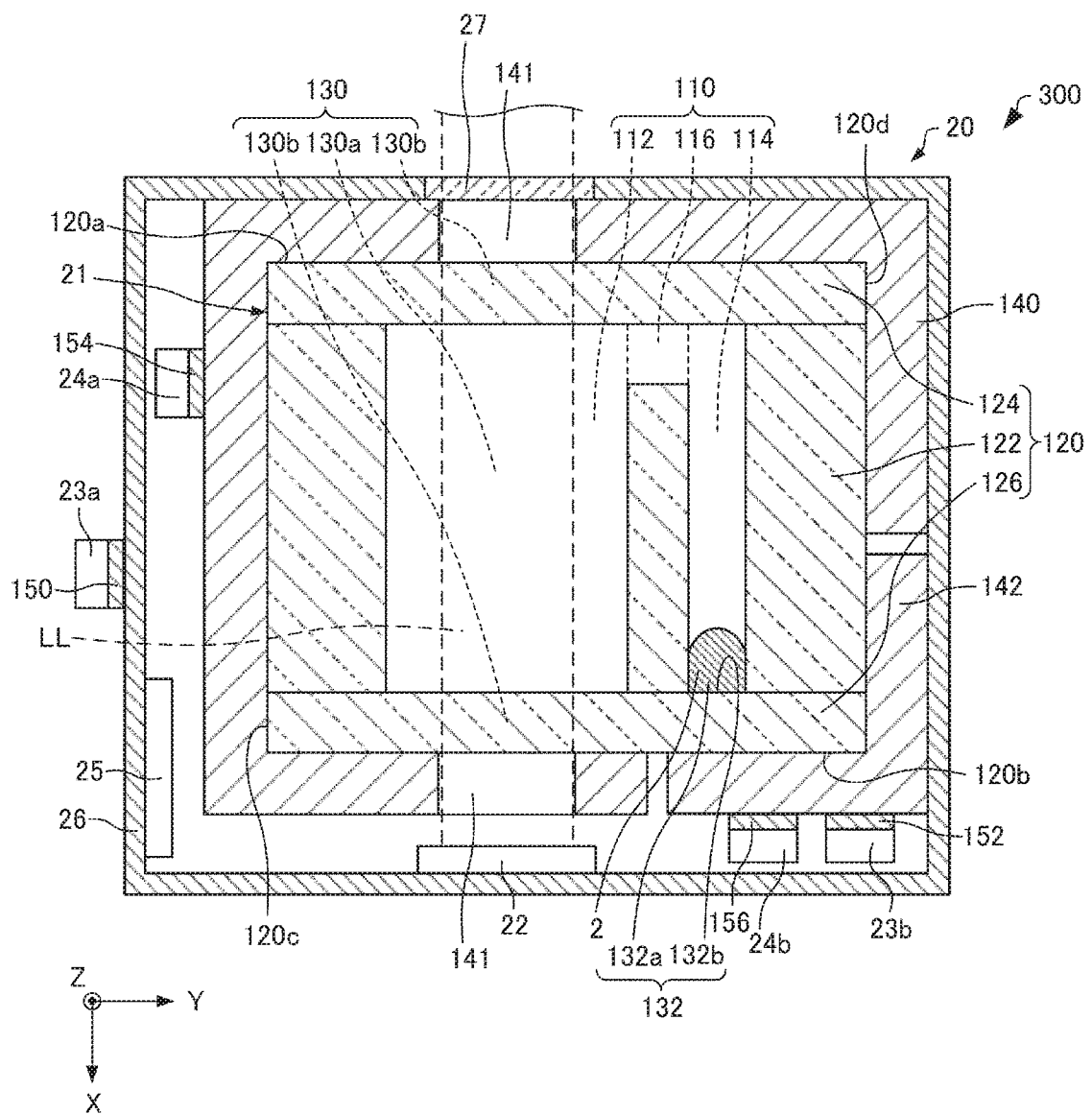
FIG. 13 is a sectional view schematically showing an atom cell unit of a frequency signal generation apparatus according to the third embodiment.

Next, a frequency signal generation apparatus according to the third embodiment will be explained with reference to the drawings. FIG. 13 is a sectional view schematically showing an atom cell unit 20 of a frequency signal generation apparatus 300 according to the third embodiment. Note that, in FIG. 13, as three axes orthogonal to one another, an X-axis, Y-axis, and Z-axis are shown.

In the above described frequency signal generation apparatus 100, as shown in FIG. 5, the first temperature control element 23a is placed on the first metal member 140.

On the other hand, in the frequency signal generation apparatus 300, as shown in FIG. 13, the first temperature control element 23a is placed on the case 26. The thermal conductivity of the case 26 and the thermal conductivity of the second metal member 142 are different. Accordingly, in the frequency signal generation apparatus 300, the time until the temperature change generated in temperature control by the first temperature control element 23a is transferred to the first temperature detection element 24a and the time until the temperature change generated in temperature control by the second temperature control element 23b is transferred to the second temperature detection element 24b are different. Thereby, in the frequency signal generation apparatus 300, the phase of the temperature control loop L1 and the phase of the temperature control loop L2 may be made different.

Note that, if the first temperature control element 23a is placed on the first metal member 140 and the second temperature control element 23b is placed on the case 26, the phase of the temperature control loop L1 and the phase of the temperature control loop L2 may be made different. However, in consideration of the control of the temperature of the second part 132 with higher accuracy than the control of the temperature of the first part 130, the second temperature control element 23b is placed on the second metal member 142 closer to the second part 132 more preferably than on the case 26.

If the phase of the temperature control loop L1 and the phase of the temperature control loop L2 are different, in the above described frequency signal generation apparatus 200, the first temperature control element 23a may be placed on the case 26 and, in the frequency signal generation apparatus according to the modified example of the second embodiment, the first temperature control element 23a may be placed on the case 26.

4. Fourth Embodiment

Figure 14:
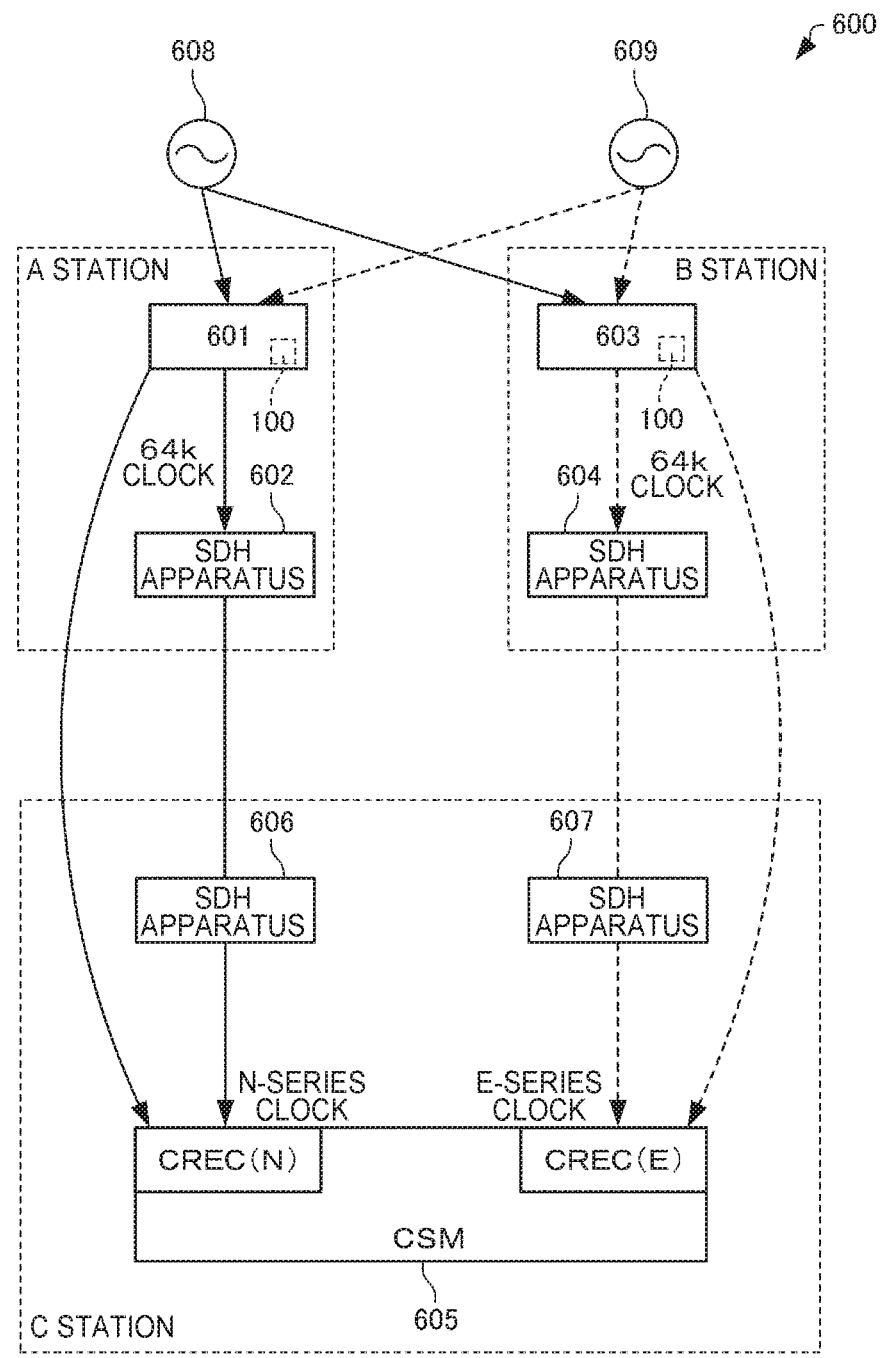
FIG. 14 is a schematic configuration diagram showing a frequency signal generation system according to the fourth embodiment.

Next, a frequency signal generation system 600 according to the fourth embodiment will be explained with reference to the drawings. The frequency signal generation system 600 may be called a clock transmission system (timing server) 600. FIG. 14 is a schematic configuration diagram showing the clock transmission system 600.

A clock transmission system according to the invention includes a frequency signal generation apparatus according to the invention. As an example, the frequency signal generation system 600 including the frequency signal generation apparatus 100 will be explained below.

The clock transmission system 600 is a system having N (Normal)-series and E (Emergency)-series redundant configurations for synchronizing clocks of respective apparatuses within a time-division multiplexing network.

As shown in FIG. 14, the clock transmission system 600 includes an A station (upstream (N-series)) clock supply apparatus 601 and an SDH (Synchronous Digital Hierarchy) apparatus 602, a B station (upstream (E-series)) clock supply apparatus 603 and an SDH apparatus 604, and a C station (downstream) clock supply apparatus 605 and SDH apparatuses 606, 607. The clock supply apparatus 601 has the frequency signal generation apparatus 100 and generates N-series clock signals. The frequency signal generation apparatus 100 within the clock supply apparatus 601 generates clock signals in synchronization with higher-accuracy clock signals from master clocks 608, 609 including atomic oscillators using cesium.

The SDH apparatus 602 transmits and receives main signals based on the clock signals from the clock supply apparatus 601, and superimposes the N-series clock signals on the main signals and transmits the signals to the downstream clock supply apparatus 605. The clock supply apparatus 603 has the frequency signal generation apparatus 100 and generates the E-series clock signals. The frequency signal generation apparatus 100 within the clock supply apparatus 603 generates clock signals in synchronization with higher-accuracy clock signals from the master clocks 608, 609 including the atomic oscillators using cesium.

The SDH apparatus 604 transmits and receives main signals based on the clock signals from the clock supply apparatus 603, and superimposes the E-series clock signals on the main signals and transmits the signals to the downstream clock supply apparatus 605. The clock supply apparatus 605 receives the clock signals from the clock supply apparatuses 601, 603 and generates clock signals in synchronization with the received clock signals.

The clock supply apparatus 605 normally generates clock signals in synchronization with the N-series clock signals from the clock supply apparatus 601. Then, when an abnormality occurs in the N-series, the clock supply apparatus 605 generates clock signals in synchronization with the E-series clock signals from the clock supply apparatus 603. By the switching from the N-series to the E-series, stable clock supply may be secured and reliability of the clock path network may be made higher. The SDH apparatus 606 transmits and receives main signals based on the clock signals from the clock supply apparatus 605. Similarly, the SDH apparatus 607 transmits and receives main signals based on the clock signals from the clock supply apparatus 605. Thereby, the apparatus of the C station may be synchronized with the apparatus of the A station or B station.

The frequency signal generation system 600 includes the frequency signal generation apparatus 100. Accordingly, in the frequency signal generation system 600, instability of the temperature of the atom cell 21 may be suppressed.

Note that the frequency signal generation apparatus in which the phase of the temperature control loop L1 and the phase of the temperature control loop L2 are different may be e.g. a magnetic sensor, not the atomic oscillator.

Note that the frequency signal generation system including the frequency signal generation apparatus in which the phase of the temperature control loop L1 and the phase of the temperature control loop L2 are different is not limited to the clock transmission system, but may be various electronic apparatuses, communication systems, and the like. For example, the system may be a smartphone, tablet terminal, time piece, cell phone, digital still camera, liquid ejection device (e.g. inkjet printer), personal computer, television, video camera, video tape recorder, car navigation system, pager, personal digital assistance, electronic dictionary, calculator, electronic game machine, word processor, work station, videophone, security television monitor, electronic binoculars, POS terminal, medical device (e.g. electronic thermometer, sphygmomanometer, blood glucose meter, electrocardiographic measurement system, ultrasonic diagnostic system, electronic endoscope, or magnetocardiograph), fish finder, GNSS (Global Navigation Satellite System) reference frequency standard, various measuring instruments, meters and gauges (e.g. meters for automobiles, aircrafts, and ships), flight simulator, digital terrestrial broadcasting system, cell phone base station, or vehicle (automobile, aircraft, ship, or the like).

Part of the configurations of the invention may be omitted in the range having the features and advantages described in this application, and the respective embodiments and modified examples may be combined.

The invention includes substantially the same configurations (e.g. configurations having the same functions, methods, and results or configurations having the same purposes and advantages) as the configurations explained in the embodiments. Further, the invention includes configurations in which non-essential parts of the configurations explained in the embodiments are replaced. Furthermore, the invention includes configurations that offer the same advantages or configurations that achieve the same purposes as those of the configurations explained in the embodiments. Moreover, the invention includes configurations in which known techniques are added to the configurations explained in the embodiments.

What is claimed is:

1. A frequency signal generation apparatus comprising:
   a light source;
   an atom cell including:
       a first part with gaseous alkali metal atoms therein and through which light output from the light source passes; and
       a second part with liquid alkali metal atoms therein;
   a first temperature control element that controls a temperature of the first part;
   a second temperature control element that controls a temperature of the second part to be at a lower temperature than the temperature of the first part;
   a first temperature detection element that detects the temperature of the first part;
   a second temperature detection element that detects the temperature of the second part;
   a first thermally conductive member covering at least a part of the first part; and
   a second thermally conductive member covering at least a part of the second part,
   wherein the first temperature control element is thermally connected to the second temperature detection element,
   the second temperature control element is thermally connected to the first temperature detection element,
   a first temperature control loop of the first part includes the first temperature control element and the first temperature detection element, the first temperature control loop having a first phase,
   a second temperature control loop of the second part includes the second temperature control element and the second temperature detection element, the second temperature control loop having a second phase,
   the first phase is different from the second phase,
   the first thermally conductive member is spaced apart from the second thermally conductive member,
   the first temperature control element is connected to the first thermally conductive member by a first connection member,
   the second temperature control element is connected to the second thermally conductive member by a second connection member, and
   a thermal conductivity of the first connection member is different from a thermal conductivity of the second connection member.

2. The frequency signal generation apparatus according to claim 1,
   wherein the first temperature control element is separated from the first temperature detection element by a first minimum distance,
   the second temperature control element is separated from the second temperature detection element by a second minimum distance, and the first minimum distance is different from the second minimum distance.

3. The frequency signal generation apparatus according to claim 1,
wherein a second minimum distance between the second temperature control element and the second temperature detection element is smaller than a first minimum distance between the first temperature control element and the first temperature detection element.

4. The frequency signal generation apparatus according to claim 1,
wherein the first temperature control element is disposed on the first thermally conductive member,
the second temperature control element is disposed on the second thermally conductive member, and
a thermal conductivity of the first thermally conductive member is different from a thermal conductivity of the second thermally conductive member.

5. The frequency signal generation apparatus according to claim 1,
wherein the first temperature detection element is disposed on the first thermally conductive member,
the second temperature detection element is disposed on the second thermally conductive member, and
a thermal conductivity of the first thermally conductive member is different from a thermal conductivity of the second thermally conductive member.

6. The frequency signal generation apparatus according to claim 1,
wherein the first temperature detection element is connected to the first thermally conductive member by a first connection member,
the second temperature detection element is connected to the second thermally conductive member by a second connection member, and
a thermal conductivity of the first connection member is different from a thermal conductivity of the second connection member.

7. The frequency signal generation apparatus according to claim 1, further comprising a case housing the atom cell, the first thermally conductive member, and the second thermally conductive member,
wherein the first temperature control element is disposed on the case,
the second temperature control element is disposed on the second thermally conductive member, and
a thermal conductivity of the case is different from a thermal conductivity of the second thermally conductive member.

8. The frequency signal generation apparatus according to claim 1,
wherein the first temperature control loop of the first part includes a first circuit that outputs a first signal according to a first output of the first temperature detection element to the first temperature control element,
the second temperature control loop of the second part includes a second circuit that outputs a second signal according to a second output of the second temperature detection element to the second temperature control element, and
a first gain of the first circuit is different from a second gain of the second circuit.

9. A frequency signal generation system comprising a frequency signal generation apparatus, the frequency signal generation apparatus including:
a light source;
an atom cell including:
a first part with gaseous alkali metal atoms therein and through which light output from the light source passes; and
a second part with liquid alkali metal atoms therein;
a first temperature control element that controls a temperature of the first part;
a second temperature control element that controls a temperature of the second part to be at a lower temperature than the temperature of the first part;
a first temperature detection element that detects the temperature of the first part;
a second temperature detection element that detects the temperature of the second part;
a first thermally conductive member covering at least a part of the first part; and
a second thermally conductive member covering at least a part of the second part,
wherein the first temperature control element is thermally connected to the second temperature detection element,
the second temperature control element is thermally connected to the first temperature detection element, and
a first temperature control loop of the first part includes the first temperature control element and the first temperature detection element, and the first temperature control loop has a first phase,
a second temperature control loop of the second part includes the second temperature control element and the second temperature detection element, and the second temperature control loop has a second phase,
the first phase is different from the second phase,
the first thermally conductive member is spaced apart from the second thermally conductive member,
the first temperature control element is connected to the first thermally conductive member by a first connection member,
the second temperature control element is connected to the second thermally conductive member by a second connection member, and
a thermal conductivity of the first connection member is different from a thermal conductivity of the second connection member.

10. A frequency signal generation apparatus comprising:
a light source;
an atom cell positioned in light receiving relation relative to the light source, the atom cell including an internal space subdivided into a cavity and a reservoir fluidly interconnected to the cavity by a communication hole,
gaseous alkali metal atoms residing within a region of the cavity through which light from the light source exclusively passes;
liquid alkali metal atoms contained within the reservoir;
a first heater proximate the region and relatively distant from the reservoir;
a second heater proximate the reservoir and relatively distant from the region;
a first thermistor that is:
proximate the region and relatively distant from the reservoir, and
thermally connected to the second heater;
a second thermistor that is:
proximate the reservoir and relatively distant from the region, and
thermally connected to the first heater;
a first temperature control loop having a first phase and including the first heater and the first thermistor, the first temperature control loop being configured to control a temperature of the region; and a second temperature control loop having a second phase and including the second heater and the second thermistor, the second temperature control loop being configured to control a temperature of the reservoir to be lower than the temperature of the region;

a first thermally conductive outer shell surrounding at least a part of a periphery of the region;

a second thermally conductive outer shell surrounding at least a part of a periphery of the reservoir;

a first connection member connectively interposed between the first heater and the first thermally conductive outer shell; and a second connection member connectively interposed between the second heater and the second thermally conductive outer shell, wherein the second phase is different from the first phase, the first thermally conductive outer shell is spaced apart from the second thermally conductive outer shell, and a thermal conductivity of the first connection member is different from a thermal conductivity of the second connection member.

11. The frequency signal generation apparatus according to claim 10, wherein the first heater is separated from the first thermistor by a first minimum distance, the second heater is separated from the second thermistor by a second minimum distance, and the first minimum distance is different from the second minimum distance.

12. The frequency signal generation apparatus according to claim 10, wherein the first heater is separated from the first thermistor by a first minimum distance, the second heater is separated from the second thermistor by a second minimum distance, and the second minimum distance is smaller than the first minimum distance.

13. The frequency signal generation apparatus according to claim 10, wherein the first heater is disposed on the first thermally conductive outer shell, the second heater is disposed on the second thermally conductive outer shell, and a thermal conductivity of the first thermally conductive outer shell is different from a thermal conductivity of the second thermally conductive outer shell.

14. The frequency signal generation apparatus according to claim 10, wherein the first thermistor is disposed on the first thermally conductive outer shell, the second thermistor is disposed on the second thermally conductive outer shell, and a thermal conductivity of the first thermally conductive outer shell is different from a thermal conductivity of the second thermally conductive outer shell.

15. The frequency signal generation apparatus according to claim 10, further comprising:

a third connection member connectively interposed between the first thermistor and the first thermally conductive outer shell; and a fourth connection member connectively interposed between the second thermistor and the second thermally conductive outer shell, wherein a thermal conductivity of third connection member is different from a thermal conductivity of the fourth connection member.

16. The frequency signal generation apparatus according to claim 10, further comprising a case housing the atom cell, the first thermally conductive outer shell, and the second thermally conductive outer shell, wherein the first heater is disposed on the case, the second heater is disposed on the second thermally conductive outer shell, and a thermal conductivity of the case is different from a thermal conductivity of the second thermally conductive outer shell.

\* \* \* \* \*